(12) United States Patent
Yu et al.

(10) Patent No.: US 10,720,495 B2
(45) Date of Patent: Jul. 21, 2020

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Tsung-Yuan Yu, Taipei (TW); Hao-Yi Tsai, Hsinchu (TW); Chao-Wen Shih, Hsinchu County (TW); Hung-Yi Kuo, Taipei (TW); Chia-Chun Miao, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 43 days.

(21) Appl. No.: 14/302,739

(22) Filed: Jun. 12, 2014

(65) Prior Publication Data

US 2015/0364376 A1   Dec. 17, 2015

(51) Int. Cl.
*H01L 21/78* (2006.01)
*H01L 29/06* (2006.01)
*H01L 23/00* (2006.01)
*H01L 21/304* (2006.01)

(52) U.S. Cl.
CPC ...... *H01L 29/0657* (2013.01); *H01L 21/3043* (2013.01); *H01L 21/78* (2013.01); *H01L 24/11* (2013.01); *H01L 24/13* (2013.01); *H01L 2224/94* (2013.01); *H01L 2924/35* (2013.01); *H01L 2924/3512* (2013.01)

(58) Field of Classification Search
CPC ..... H01L 21/782; H01L 21/82; H01L 23/485; H01L 23/522; H01L 21/304; H01L 21/3043; H01L 21/78–86
See application file for complete search history.

(56) References Cited

U.S. PATENT DOCUMENTS

| | | | | |
|---|---|---|---|---|
| 5,266,528 A * | 11/1993 | Yamada | ................. | B28D 5/022 148/DIG. 28 |
| 5,972,781 A * | 10/1999 | Wegleiter | ................ | H01L 21/78 257/E21.599 |
| 6,791,197 B1 * | 9/2004 | Katz | .............................. | 257/786 |
| 8,048,781 B2 * | 11/2011 | How | ..................... | H01L 21/568 257/E21.503 |
| 8,324,738 B2 * | 12/2012 | Liu et al. | ....................... | 257/781 |
| 2001/0024300 A1 * | 9/2001 | Sasahara | ................ | H01L 25/042 358/482 |
| 2003/0224540 A1 * | 12/2003 | Watanabe | .............. | H01L 21/681 438/7 |
| 2004/0217840 A1 * | 11/2004 | Lee | ...................... | H01L 21/6835 336/200 |

(Continued)

OTHER PUBLICATIONS

Tsung-Yuan Yu , U.S. Appl. No. 14/057,422 (not yet published). Application Date Oct. 18, 2013.

*Primary Examiner* — Bryan R Junge
(74) *Attorney, Agent, or Firm* — WPAT, P.C., Intellectual Property Attorneys; Anthony King

(57) ABSTRACT

A semiconductor device includes a substrate and a bump. The substrate includes a first surface and a second surface. A notch is at the second surface and at a sidewall of the substrate. A depth of the notch is smaller than about half the thickness of the substrate. The bump is disposed on the first surface of the substrate.

20 Claims, 25 Drawing Sheets

(56) References Cited

U.S. PATENT DOCUMENTS

| | | | |
|---|---|---|---|
| 2006/0113637 A1* | 6/2006 | Fujita | H01L 21/78 257/620 |
| 2006/0175697 A1* | 8/2006 | Kurosawa | H01L 21/6836 257/686 |
| 2007/0145547 A1* | 6/2007 | McKerreghan | H01L 29/0657 257/676 |
| 2008/0073757 A1* | 3/2008 | Kummerl | H01L 21/568 257/666 |
| 2008/0242003 A1* | 10/2008 | How et al. | 438/122 |
| 2008/0277806 A1* | 11/2008 | Chen | B28D 5/022 257/618 |
| 2009/0162993 A1* | 6/2009 | Yui | B28D 5/022 438/462 |
| 2009/0233401 A1* | 9/2009 | Tan | H01L 21/561 438/112 |
| 2010/0003771 A1* | 1/2010 | Nagai | H01L 21/67092 438/15 |
| 2013/0037966 A1* | 2/2013 | Qiu | H01L 23/49513 257/782 |
| 2013/0157414 A1* | 6/2013 | Ho | H01L 29/0657 438/113 |
| 2013/0292808 A1* | 11/2013 | Yen | H01L 23/552 257/660 |
| 2014/0138855 A1* | 5/2014 | Van Gemert et al. | 257/788 |
| 2014/0273402 A1* | 9/2014 | Tsai | H01L 21/78 438/463 |
| 2014/0339712 A1* | 11/2014 | Alvarado et al. | 257/786 |
| 2015/0132867 A1* | 5/2015 | Tsao | H01L 21/6835 438/14 |

* cited by examiner

SEMICONDUCTOR DEVICE AND MANUFACTURING METHOD THEREOF

BACKGROUND

Presently, many modern applications require electronic equipment. Therefore, consumers are increasingly demanding more processing power, lower electrical power usage and cheaper devices. As the electronic industry strives to meet these demands and more complicated and denser configurations, miniaturization will result in an extension of the number of chips per wafer and the number of transistors per chip, as well as a reduction in power usage. A wafer level packaging (WLP) technology has been gaining in popularity and is widely applied, due to electronic components being designed to be lighter, smaller, more multifunctional, more powerful, more reliable and less expensive. This technology provides a wafer level manufacturing of semiconductor devices with high functions and complicated structures while the size of the semiconductor devices is minimized.

During the operations of the wafer level manufacturing of a semiconductor device, the semiconductor device is sawed or singulated by a mechanical or laser blade. The singulation operations involve many complicated manufacturing processes that cause the semiconductor device to be easily damaged during the singulation operations. Since damages such as poor reliability of the molding, cracking and delamination are poorly controlled, improvements for a singulation-related technology continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

A more complete understanding of the present disclosure may be derived by referring to the detailed description and claims when considered in connection with the Figures, where like reference numbers refer to similar elements throughout the Figures, and:

DETAILED DESCRIPTION

Figure 1:
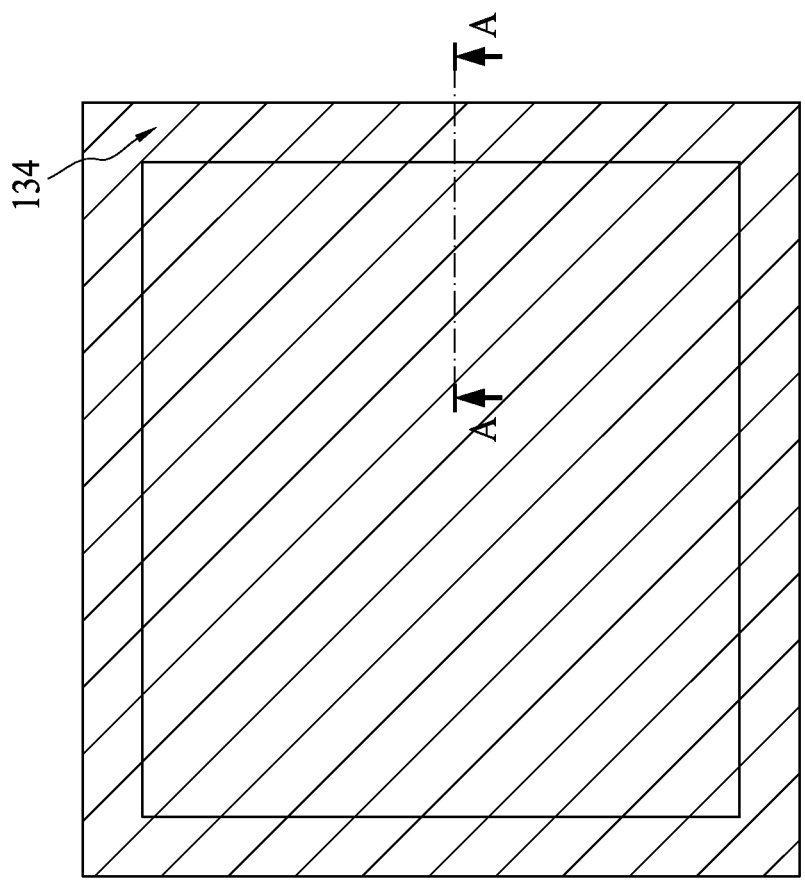
FIG. 1 is a top view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A semiconductor device is manufactured by a number of operations. During the manufacturing, a wafer is sawed to singulate out several chips or dies on a dicing tape. The wafer is sawed in accordance with several predetermined scribing lines in order to individualize several dies. After singulation, dies are separated from the dicing tape by an eject pin, which pushes and detaches a single die from the dicing tape. Upon the detaching operation, the single die may hit a corner of adjacent dies and thus, those dies surrounding the detached die might be damaged due to being hit on their corners.

In the present disclosure, a notch is formed at a corner of each of the dies. Since the notch forms an empty space at the corner of the dies, upon a detaching operation, the notch is able to avoid corner hitting between the detached dies and adjacent dies. In various embodiments, some damages such as cracking or delamination usually occur at the corners of those dies because an external force (e.g., corner hitting) is easily applied at a single spot of the corners. Since the notch is able not only to avoid receiving the external force, but also to disperse the external force at multiple spots, forming a notch around the corners of the dies decreases the probability of being damaged at the corners of those dies. As a result, a reliability of the dies or semiconductor devices is improved.

In describing and claiming the present disclosure, the following terminology will be used in accordance with the definitions set forth below.

As used herein, a "substrate" refers to a bulk substrate on which various layers and device structure are formed. In some embodiments, the bulk substrate includes silicon or a compound semiconductor, such as GaAs, InP, Si/Ge, or SiC. Examples of the layers include dielectric layers, doped layers, polysilicon layers, or conductive layers. Examples of the device structures include transistors, resistors, and/or capacitors, which are interconnected through an interconnect layer to additional integrated circuits. In some embodiments, the bulk substrate includes a semiconductor substrate such as a polished wafer, an epi wafer, an argon anneal wafer, a hai wafer and a silicon on insulator (SOI) wafer.

As used herein, the "wafer" refers to a semiconductor wafer, which mainly experiences two complex manufacturing processes, i.e., front-end manufacturing, and back-end manufacturing, each involving potentially hundreds of operations. Front-end manufacturing involves the formation of several die areas on the surface of the wafer. Each die is typically identical and contains circuits formed by electrically connecting active and passive components. Back-end manufacturing involves singulating individual die from the finished wafer and packaging the die to provide structural support and environmental isolation. Active electrical components, such as transistors, have the ability to control the flow of electrical current. Passive electrical components, such as capacitors, inductors, resistors, and transformers, create a relationship between voltage and current that is to perform electrical circuit functions.

As used herein, "active and passive components" refers to components, which are formed on the surface of the wafer by a series of process operations including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as to enable the transistor to promote or restrict the flow of electrical current upon the application of an electric field.

Active and passive components are formed by layers of materials with different electrical properties. The layers are formed by a variety of deposition techniques determined in part by the type of material being deposited. For example, thin film deposition involves chemical vapor deposition (CVD), physical vapor deposition (PVD), electrolytic plating, and electroless plating processes. Each layer is generally patterned to form portions of active components, passive components, or electrical connections between components. The layers are patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Referring to FIG. 1, a top view of a semiconductor device 10a is depicted. In some embodiments, a notch 134 is on a periphery of the semiconductor device 10a.

Figure 2:
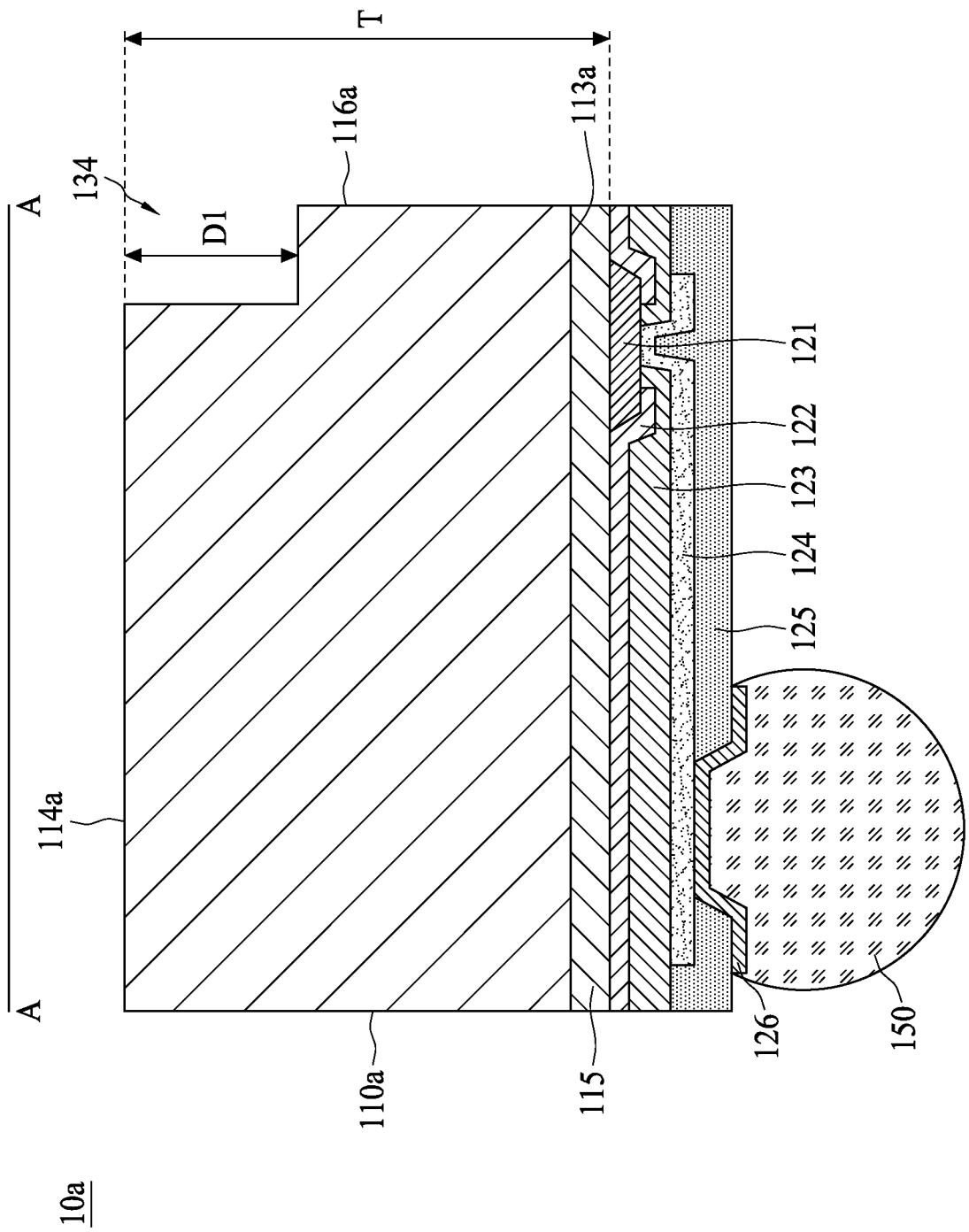
FIG. 2 is a cross-sectional view along line AA in FIG. 1.

FIG. 2 is a cross-sectional view of semiconductor device 10a along line A-A in FIG. 1. The semiconductor device 10a has a substrate 110a, an interconnect structure 115, a metal pad 121, a passivation layer 122, a first dielectric layer 123, a conductive interconnection 124, a second dielectric layer 125, an under-bump metallurgy (UBM) 126, and a bump 150. A surface 113a is the frontside surface of the substrate 110a and is opposite to a backside surface 114a of the substrate 110a. In some embodiments, the substrate 110a is, for example, bulk silicon, doped or undoped silicon. In certain embodiments, the surface 114a is processed in subsequent back-end manufacturing operations such as backside thinning.

The interconnect structure 115 includes transistors, resistors, and/or capacitors interconnected to additional integrated circuits. In certain embodiments, the semiconductor device 10a is electrically coupled to a circuit board including some circuits for electrical connection of several electrical components thereon. The circuit board may be a printed circuit board (PCB). In some embodiments, the interconnect structure 115 is fabricated to become integrated circuits (IC) or the active circuit area in subsequent manufacturing operations. In some embodiments, the semiconductor device 10a further includes a seal ring (not shown), and a portion of scribe line (not shown). The seal ring surrounds a portion of the interconnect structure 115. The seal ring provides protection to the active circuit area and avoids damage to the seal ring during the singulation operation. In other embodiments, the seal ring further includes a moisture-proof barrier layer in order to seal an edge of the active circuit area so as to maintain long term reliability. The seal ring typically includes stacked metal layers such as aluminum and some dielectric. In some embodiments, the seal ring is concurrently formed with some operations of the active circuit area.

In some embodiments, the metal pad 121 is formed on the interconnect structure 115 over the surface 113a of the substrate 110a, and includes aluminum, copper, silver, gold, nickel, tungsten, alloys thereof, and/or multi-layers thereof. The metal pad 121 is electrically coupled to the interconnect structure 115, for example, through underlying conductive traces or features. The passivation layer 122 is formed on the metal pad 121 and the interconnect structure 115, and is patterned to expose a portion of the metal pad 121. In certain embodiments, the passivation layer 122 is formed of dielectric materials such as silicon oxide, silicon nitride, or multilayers thereof.

In some embodiments, the first dielectric layer 123 is over the passivation layer 122 and covers portions of the metal pad 121. The first dielectric layer 123 is patterned to have an opening exposing a portion of the metal pad 121. In certain embodiments, the first dielectric layer 123 is formed of a polymer material.

In some embodiments, the conductive interconnection 124, which is also called post passivation interconnect (PPI) 124, includes a first portion over the first dielectric layer 123, and a second portion extending into the opening in the passivation layer 122 and the first dielectric layer 123. The second portion of conductive interconnection 124 may line the bottom and sidewalls of the opening in the first dielectric layer 123 and electrically coupled to the metal pad 121. In certain embodiments, the PPI 124 is an electrical connection between the semiconductor device 10a and an external circuitry. The PPI 124 provides a re-routing path to the circuitry of the semiconductor device 10a.

In an embodiment, the second dielectric layer 125 may be formed over the PPI 124 and the first dielectric layer 123. In certain embodiments, the second dielectric layer 125 is formed of a polymer material. The second dielectric layer 125 is patterned to form an opening exposing a portion of the PPI 124. The UBM 126 is formed to extend into the opening in the second dielectric layer 125, wherein the UBM 126 is electrically coupled to the PPI 124.

In some embodiments, the UBM 126 above the surface 113*a* is for receiving the bump 150, or other conductors such as solder ball, solder paste, etc. The UBM 126 includes a solderable surface, which provides a wetting surface for the bump 150. In other embodiments, the UBM 126 includes a conductive material such as gold, silver, copper, nickel, tungsten, aluminum, and/or alloys thereof.

In some embodiments, the bump 150 above the surface 113*a* is disposed by a ball drop, stencil, pasting, electroplating or so on. In other embodiments, the bump 150 is electrically connected to the PPI 124 and thus, the bump 150 is configured for electrically connecting with a pad disposed on another carrier or circuit board. Prior to connection with another carrier, the bump 150 is in a spherical shape, such as a ball. In some other embodiments, the bump 150 is made of a solder material or a metallic material including copper, aluminum, zinc, gold, lead or similar materials. In certain embodiments, the bump 150 is a metal pillar formed on the UBM 126 and the metal pillar is made of a metallic material including copper, aluminum, zinc, gold, lead or similar materials.

Figure 3:
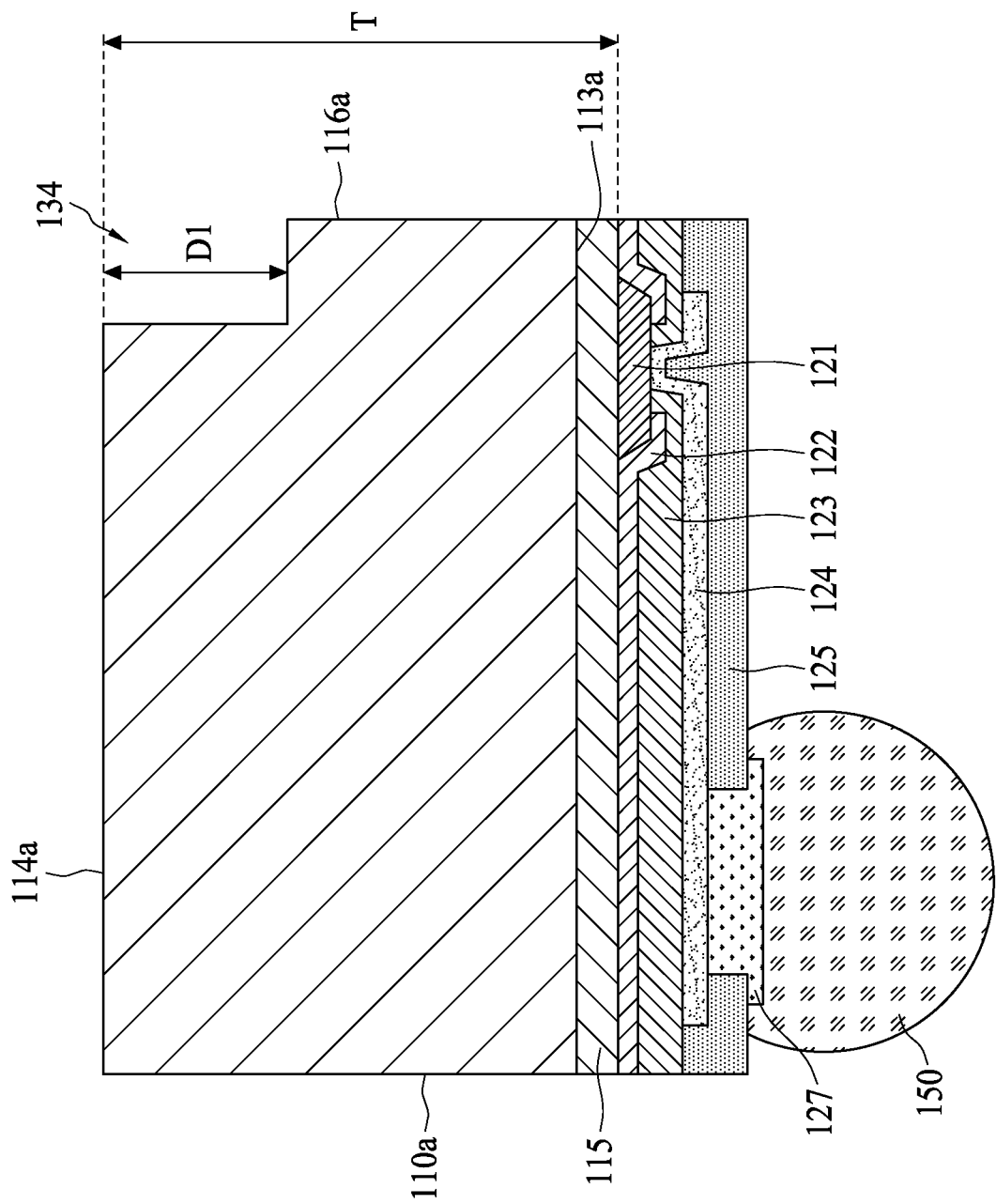
FIG. 3 is a cross-sectional view of a semiconductor device with another post passivation layer in accordance with certain embodiments of the present disclosure.
Figure 4:
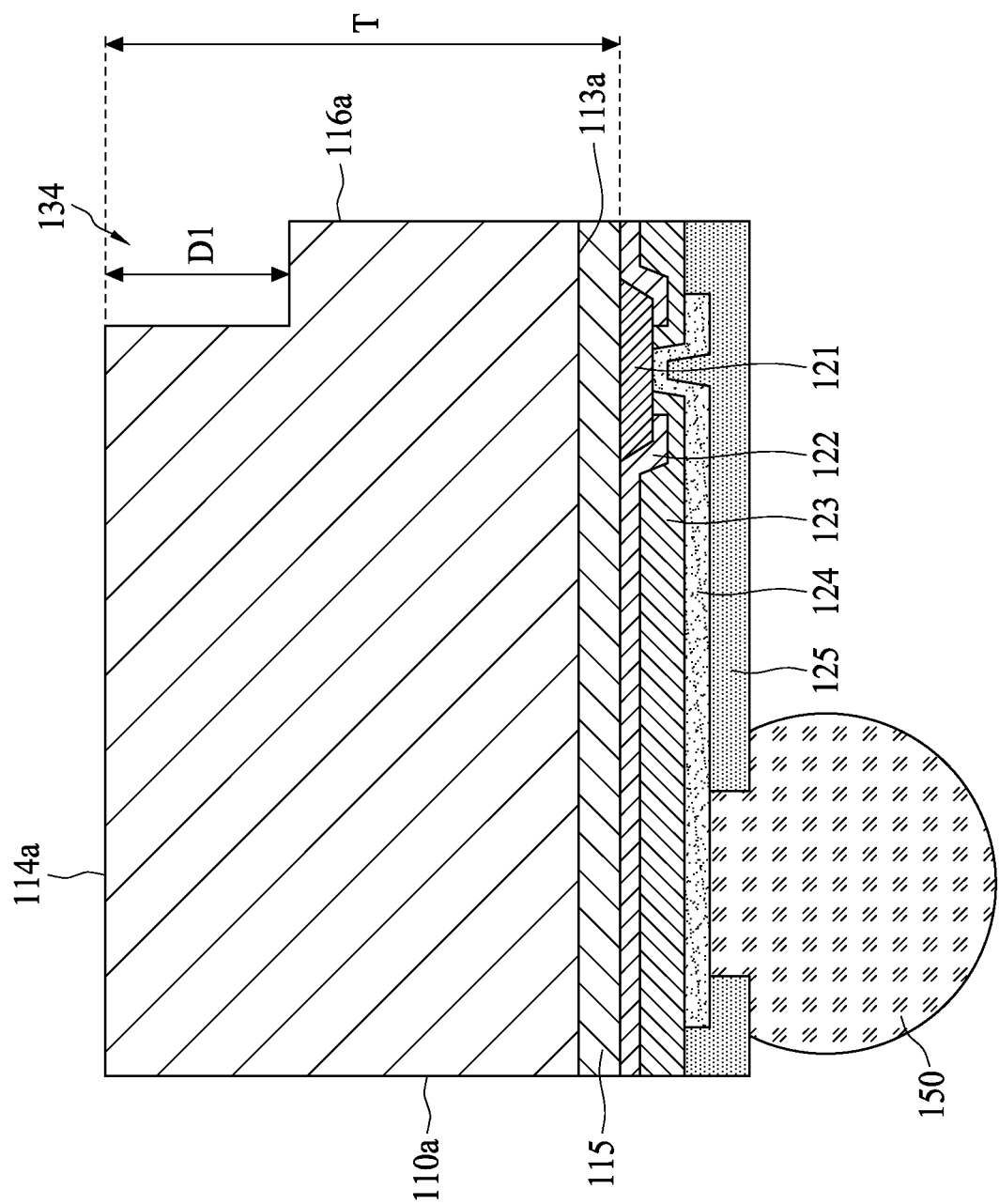
FIG. 4 is a cross-sectional view of a semiconductor device with a rectangular notch in accordance with certain embodiments of the present disclosure.
Figure 5:
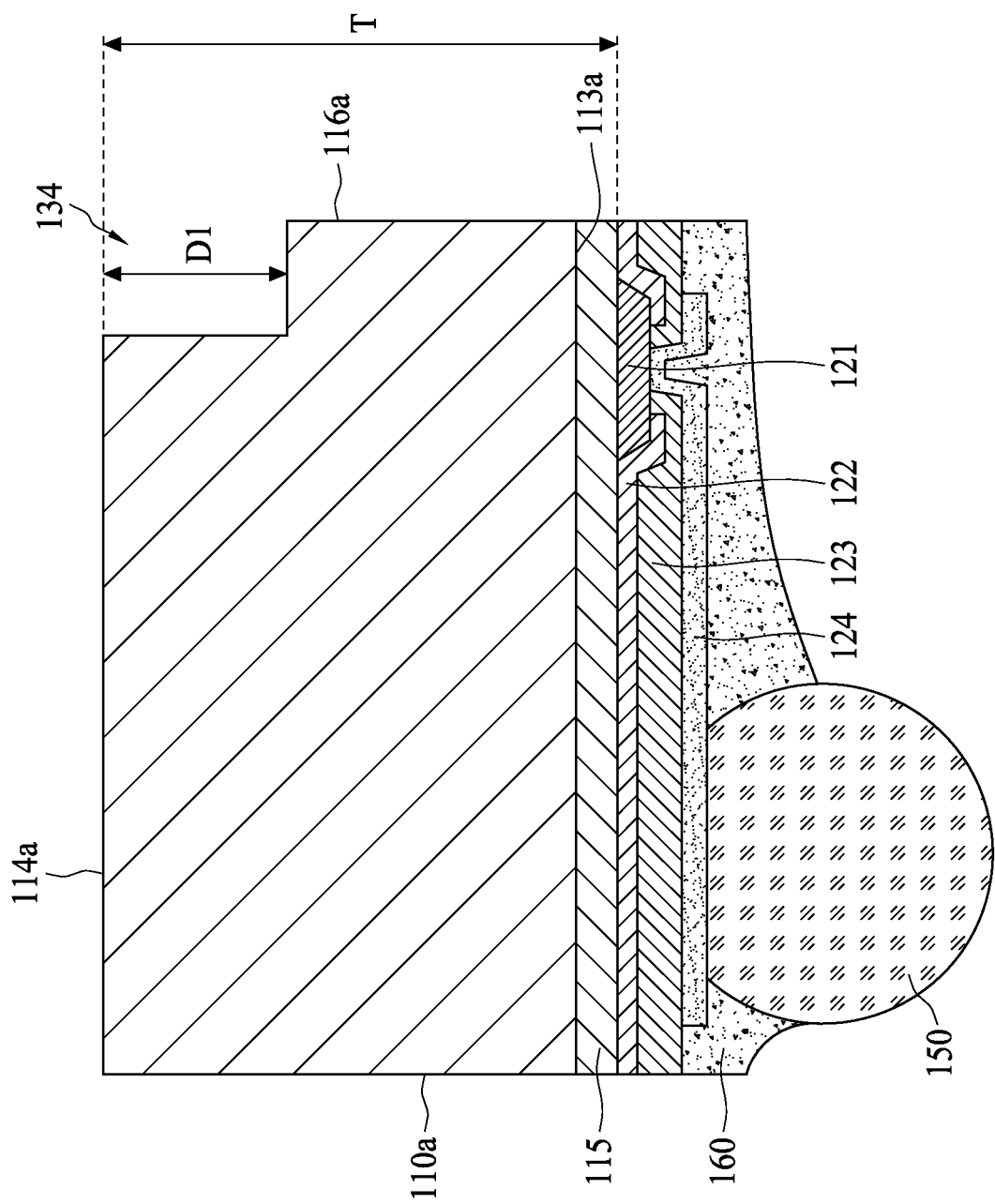
FIG. 5 is a cross-sectional view of a semiconductor device with a rectangular notch in accordance with certain embodiments of the present disclosure.

In some embodiments, as in FIG. 3, the UBM 126 is replaced with a barrier layer 127, which is a dual-layer structure including electroless Ni layer and electroless Pd layer, and named as an ENEP structure. In some embodiments, as in FIG. 4, the UBM 126 is removed so as to allow the bump 150 to be directly disposed on PPI 124. Moreover, for some embodiments, as in FIG. 5, the second dielectric layer 125 is replaced with a molding 160.

As shown in FIGS. 1 to 5, in some embodiments, a notch 134 is at the surface 114*a* and at a sidewall 116*a*. In other words, the notch 134 is located between the surface 114*a* and the sidewall 116*a* of the substrate 110*a*. In certain embodiments, the singulation operation removes a portion of scribe lines and leaves another portion of the scribe line adjacent to the seal ring.

In some embodiments, a depth D1 of the notch 134 is smaller than about half the thickness T of the substrate 110*a*, and a ratio of the depth D1 to the thickness T of the substrate 110*a* is about 0.1 to about 0.5. In certain embodiments, a ratio of the depth D1 to the thickness T of the substrate 110*a* is about 0.25 to about 0.47. In other embodiments, a ratio of the depth D1 to the thickness T of the substrate 110*a* is about 0.31 to about 0.42. In some other embodiments, a ratio of the depth D1 to the thickness T of the substrate 110*a* is about 0.14 to about 0.35.

Figure 6:
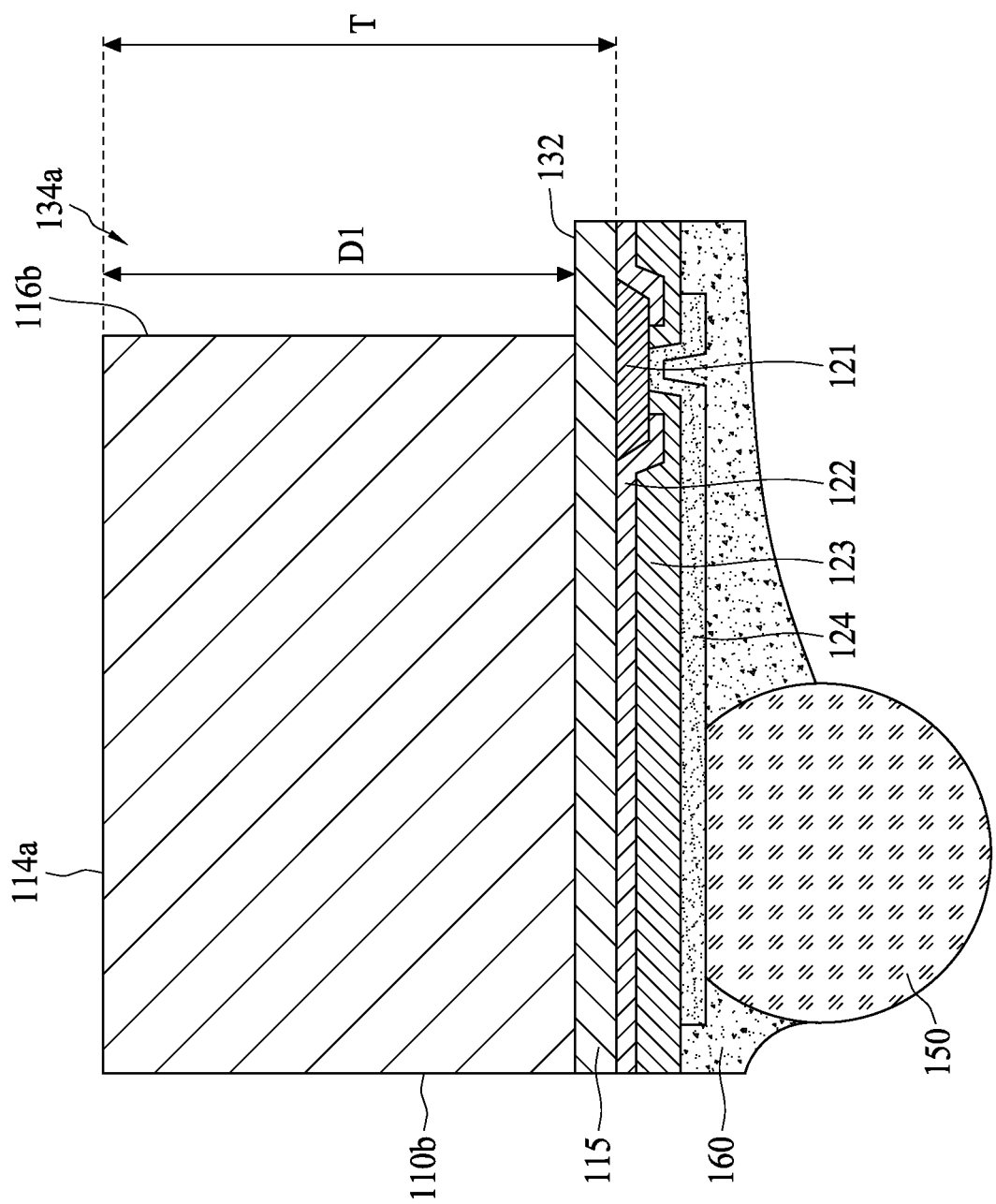
FIG. 6 is a cross-sectional view of a semiconductor device with inverse T shape in accordance with certain embodiments of the present disclosure.

The depth D1 is adjustable in accordance with various designs so as to allow the depth of the notch 134 to be greater than about half the thickness T of the substrate 110*a*. In certain embodiments as shown in FIG. 6, a bottom of the notch 134*a* reaches surface 132 of the interconnect structure 115. In other words, the cross-sectional shape of the substrate 110*b* is in an rectangular shape. The sidewall 116*b* of the substrate 110*b* is perpendicular to the surface 132 of the interconnect structure 115.

Figure 7:
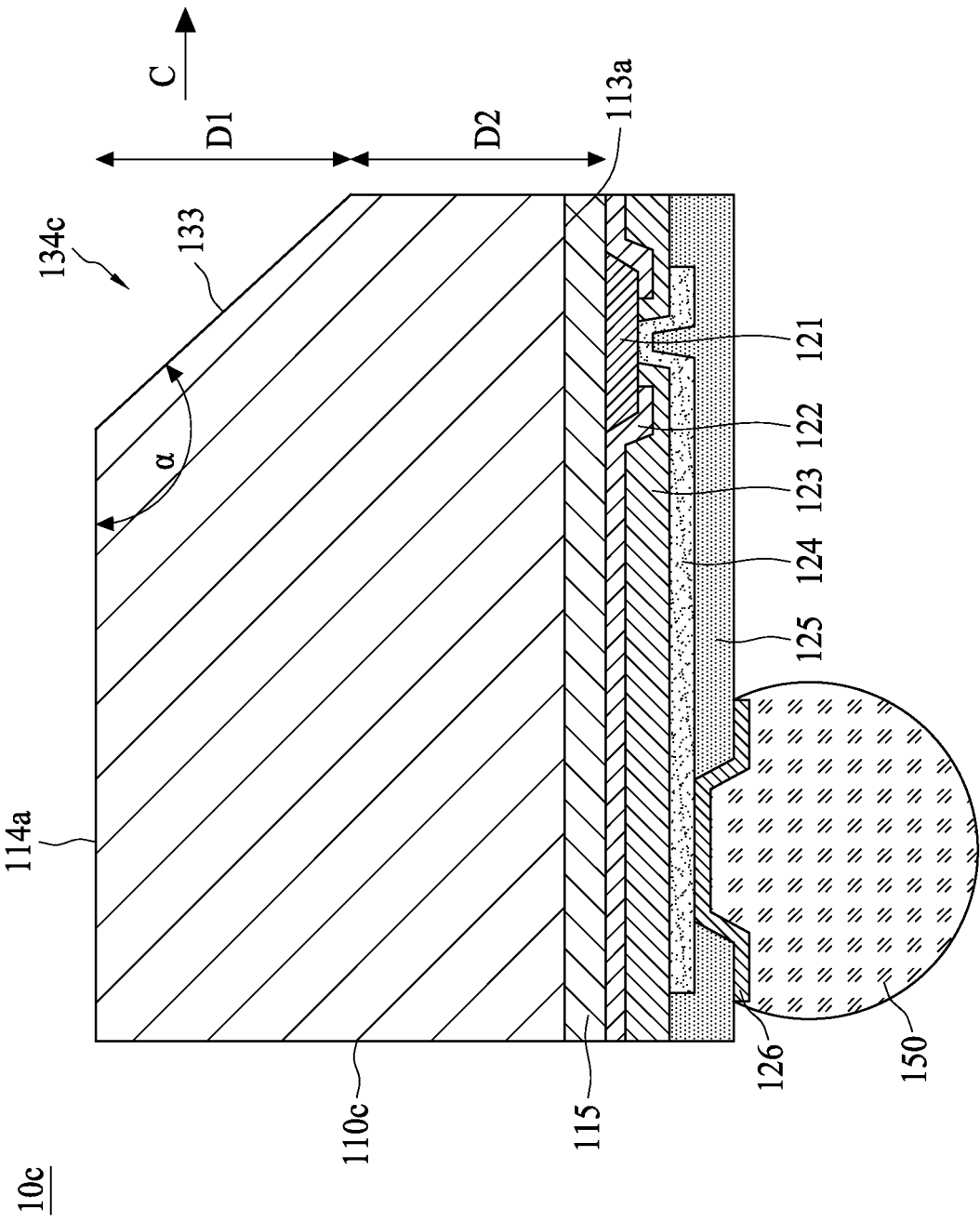
FIG. 7 is a cross-sectional view of a semiconductor device with an inclined notch in accordance with certain embodiments of the present disclosure.

In some embodiments, as in FIG. 7, a semiconductor device 10*c* includes a notch 134*c*, which includes an inclined sidewall 133 slanting toward a direction C. Particularly, the surface 114*a* forms an obtuse angle α with respect to the inclined sidewall 133 of the notch 134*c*. In some embodiments, the obtuse angle α is from about 93° to about 102°.

In certain embodiments, the obtuse angle α is from about 106° to about 118°. In other embodiments, the obtuse angle α is from about 111° to about 145°. In some certain embodiments, the obtuse angle α is from about 124° to about 178°.

Figure 8:
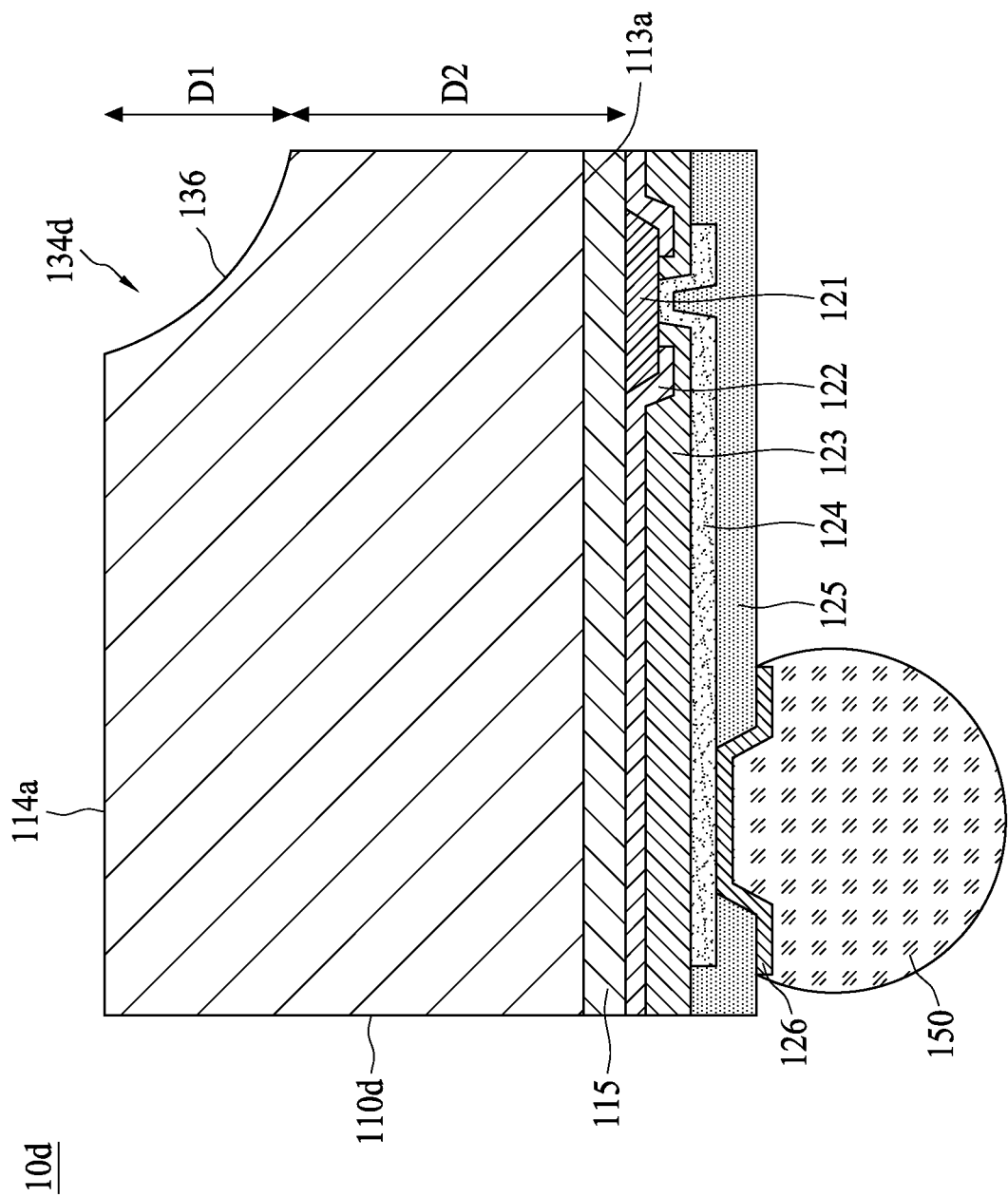
FIG. 8 is a cross-sectional view of a semiconductor device with an arc notch in accordance with some embodiments of the present disclosure.

In some embodiments, as in FIG. 8, a semiconductor device 10*d* includes a notch 134*d*, which includes an arc surface 136. In some embodiments, the curvature of the arc surface 136 is adjustable and from about ⅓ to about ½. In certain embodiments, the curvature of the arc surface 136 is from about ⅙ to about ¼. In other embodiments, the curvature of the arc surface 136 is from about 1/11 to about ⅕. In some certain embodiments, the curvature of the arc surface 136 is from about 1/17 to about 1/13.

Figure 9:
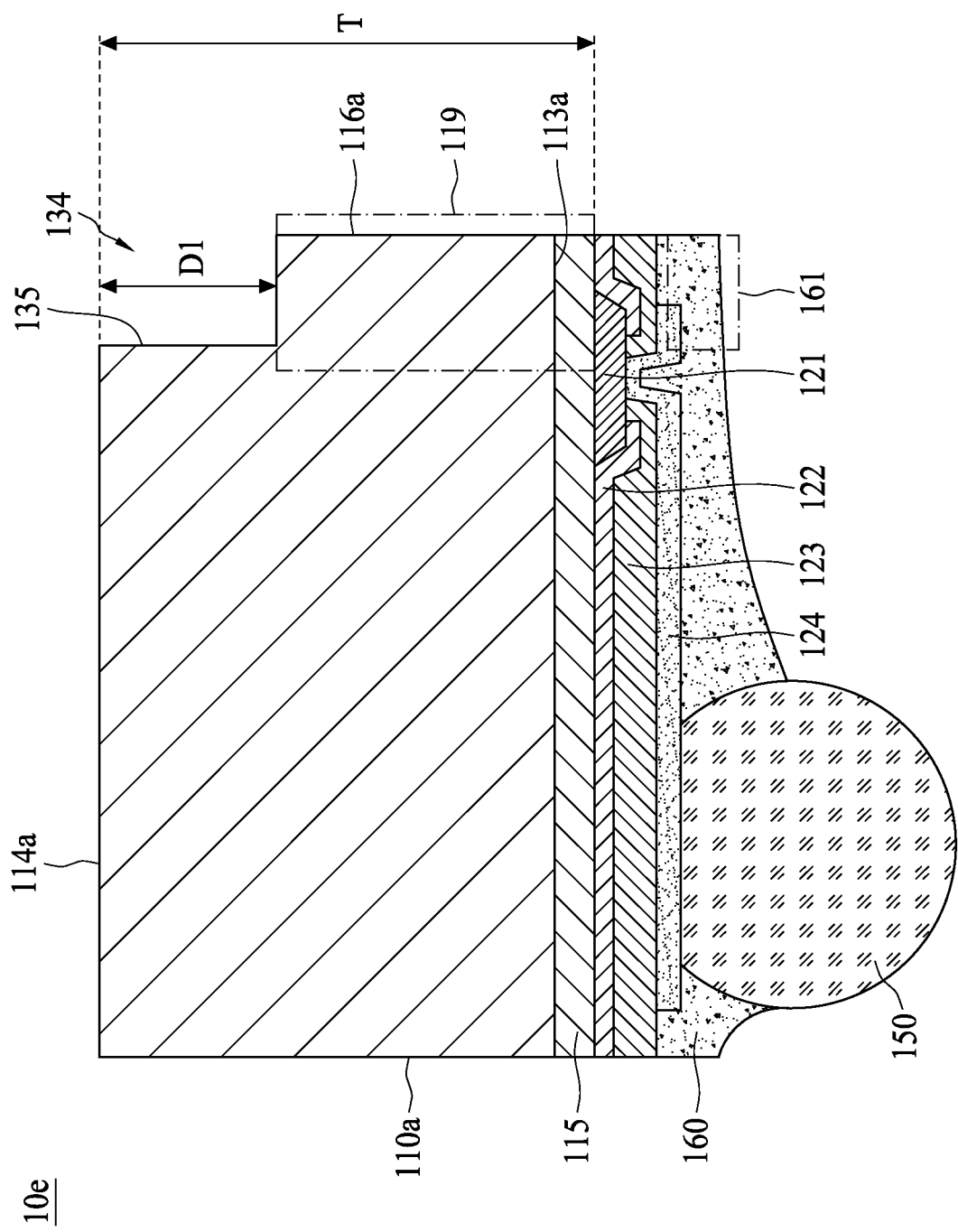
FIG. 9 is a cross-sectional view of a semiconductor device with a molding locating on a second layer of the substrate in accordance with some embodiments of the present disclosure.

In some embodiments, as in FIG. 9, a molding 160 is disposed over the substrate 110*a* and the molding 160 surrounds the bump 150 so that the bump 150 is partially within the molding 160 and partially exposed for electrically connecting with a pad on another carrier.

In some embodiments, a molding 160, including a molding compound, is above the surface 113*a*. The molding compound can be a single layer film or a composite stack. The molding compound includes various materials, for example, one or more of epoxy resins, phenolic hardeners, silicas, catalysts, pigments, mold release agents, and the like. Each of the materials for forming the molding compound has a high thermal conductivity, a low moisture absorption rate, a high flexural strength at board-mounting temperatures, or a combination of these.

Figure 10:
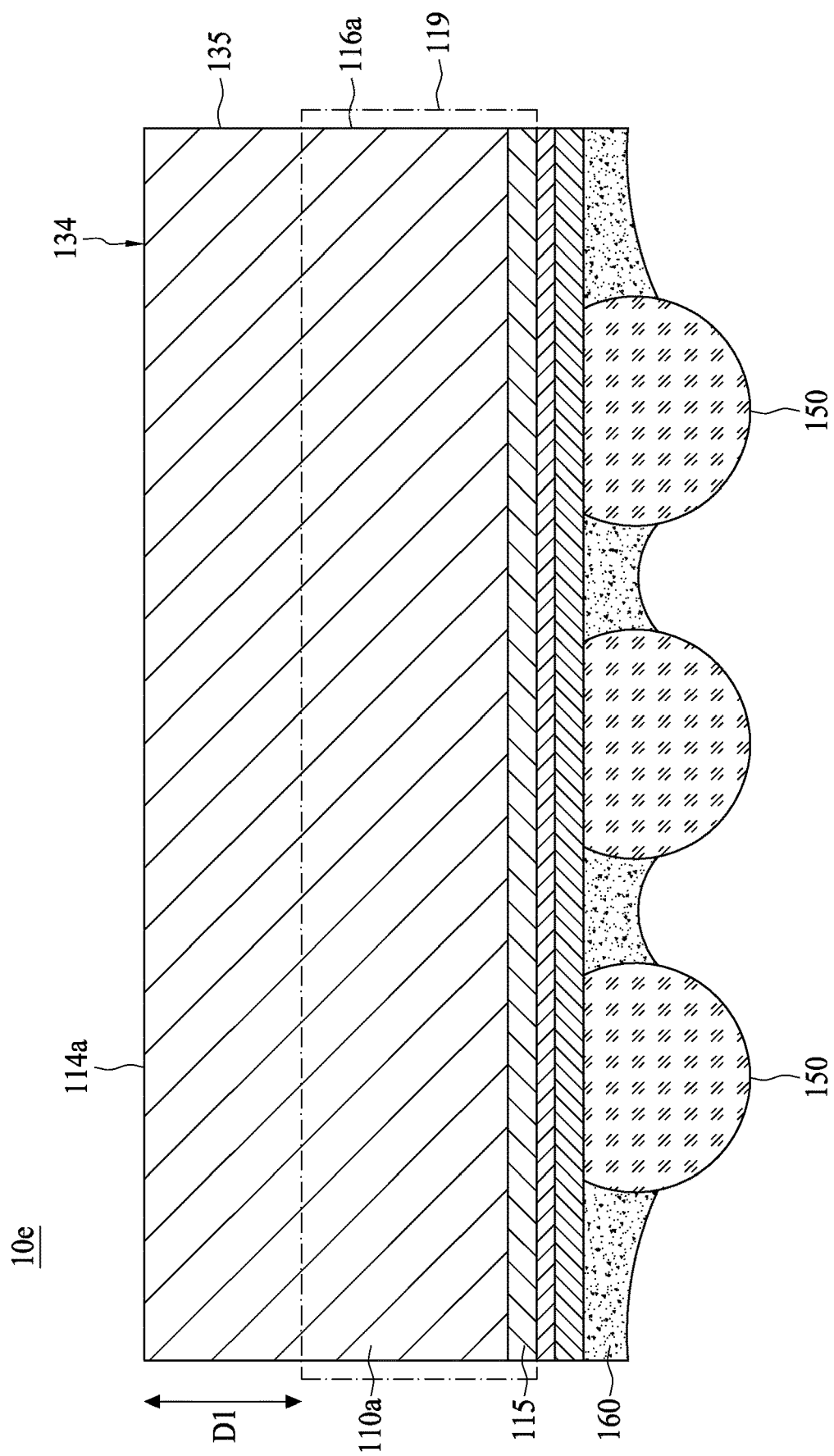
FIG. 10 is a lateral view of a portion of a substrate protruding from a sidewall of a notch in accordance with some embodiments of the present disclosure.

In some embodiments, the sidewall 116*a* of the substrate 110*a*, the edge of the interconnect structure 115, and the sidewall of a protruded portion 161 of the molding 160 are coplanar along a vertical direction. Thus, the sidewall 135 and the sidewall of the portion 119 form a stepped configuration. When looking from a normal direction of the sidewall 135, as in FIG. 10, a surface area of the portion 119 of the substrate 110*a* is about 50% of the surface area of a semiconductor device 10*e*. In certain embodiments, the surface area of the portion 119 of the substrate 110*a* is about 43% of the surface area of the semiconductor device 10*e* in accordance with the depth D1 of the notch 134. In other embodiments, the surface area of the portion 119 of the substrate 110*a* is from about 19% to about 33% of the surface area of the semiconductor device 10*e*.

Figure 11:
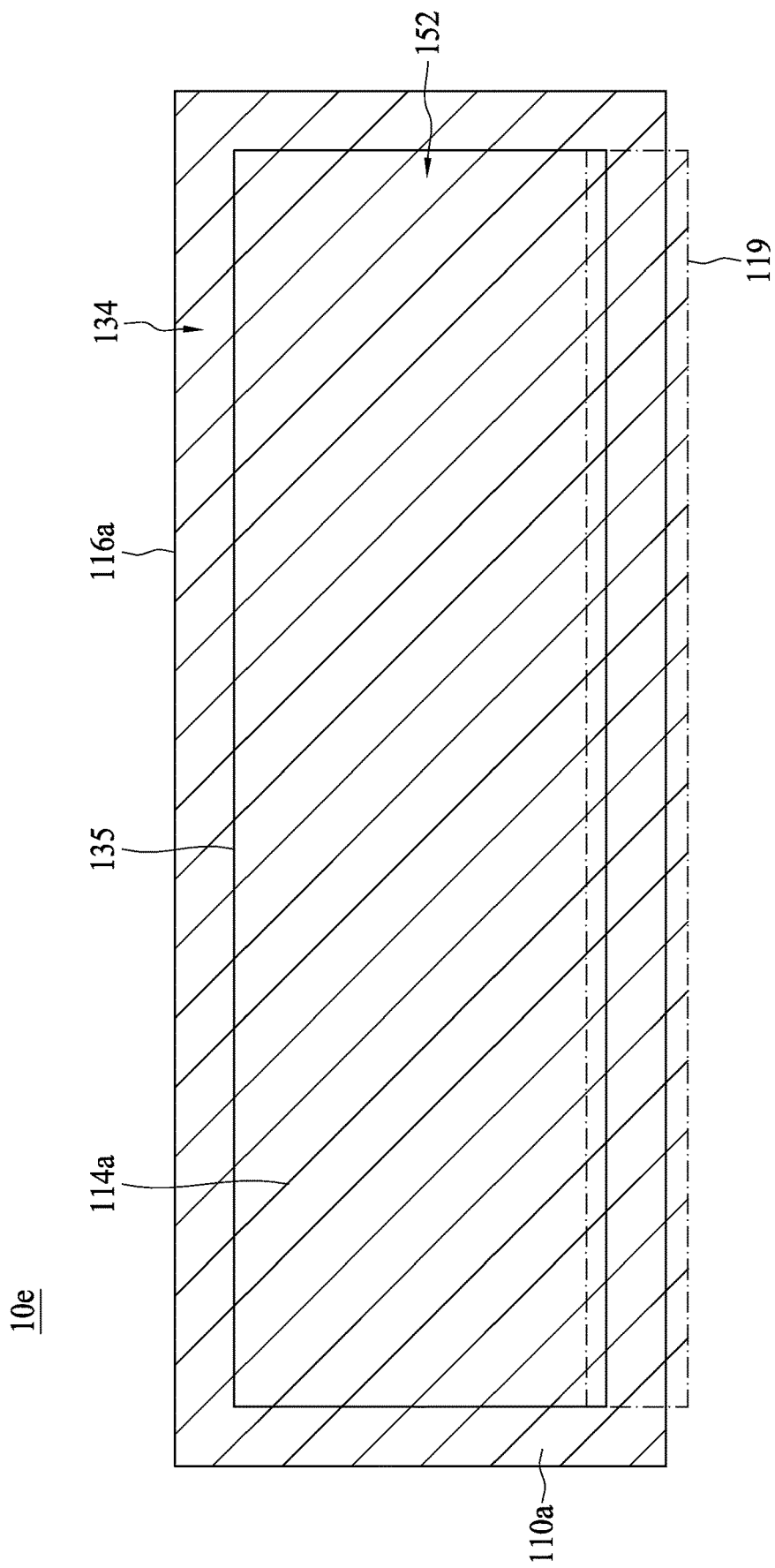
FIG. 11 is a top view of a substrate in accordance with some embodiments of the present disclosure.

In a top view, as in FIG. 11, the semiconductor device 10*e* includes a central portion 152 defined by the sidewall 135 of the notch 134. In other words, the notch 134 surrounds the surface 114*a* of the central portion 152. In some embodiments, the surface 114*a* area is adjustable in accordance with the width of the notch 134. The surface 114*a* area is about 80% of the top surface area of the substrate 110*a*. In certain embodiments, the surface 114*a* area is from about 15% to about 37% of the top surface area of the substrate 110*a*. In other embodiments, the surface 114*a* area is from about 26% to about 54% of the top surface area of the substrate 110*a*. In some certain embodiments, the surface 114*a* area is from about 47% to about 69% of the top surface area of the substrate 110*a*.

A method of manufacturing a semiconductor structure is used during the singulation operation. The present disclosure relates to a method of singulating a semiconductor substrate to form a notch. The method includes a number of operations and the description and illustrations are not deemed as a limitation as to the order of the operations.

A term "singulating" or "singulated" is used in the present disclosure to describe an operation of "dicing" a substrate to separate each individual device or "die" from one another before the substrate is mounted on a supporting member such as an adhesive film stretched across a film frame. The two most popular dicing techniques are scribing and sawing. For scribing, a diamond tipped scribe is moved across a substrate surface along pre-formed scribe lines. Upon the application of pressure, such as with a roller, the substrate separates along the scribe lines. For sawing, a diamond tipped saw cuts the substrate along the scribe lines.

Figure 12:
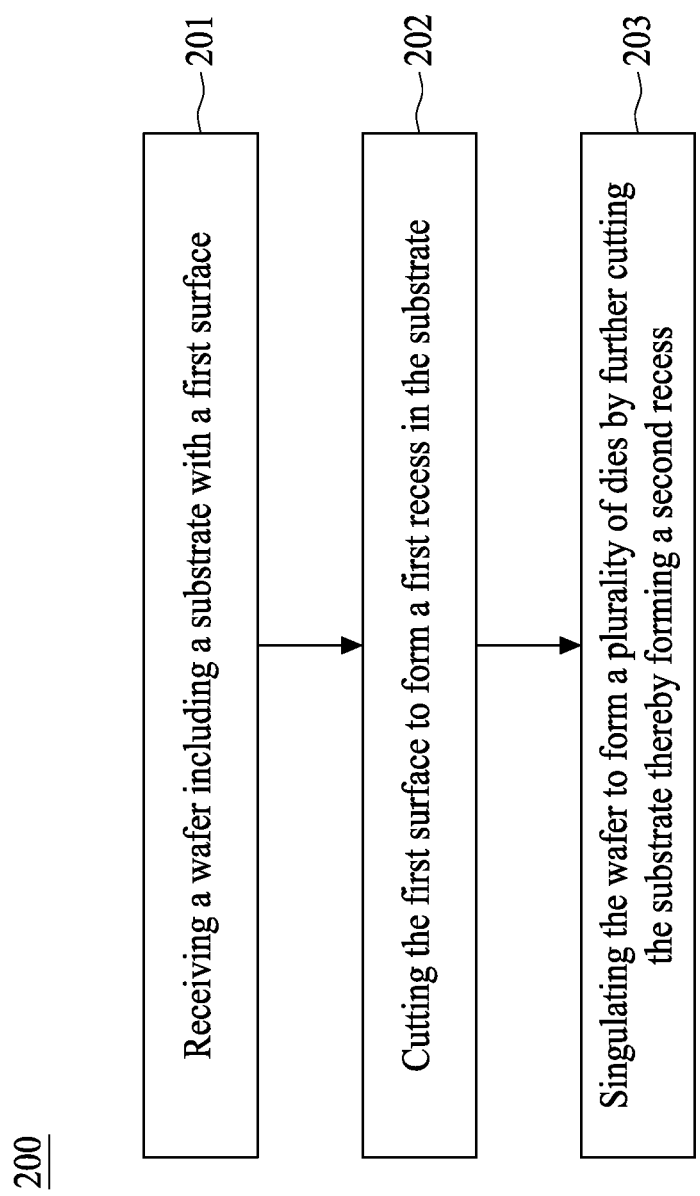
FIG. 12 is a flowchart of a method for manufacturing a semiconductor device in accordance with some embodiments of the present disclosure.

FIG. 12 is a diagram of a method 200 for manufacturing a semiconductor device in accordance with some embodiments of the present disclosure. The method 200 includes several operations which are discussed in detail with reference to FIGS. 13 to 19. At operation 201, a wafer is received. The wafer includes a substrate, wherein the substrate includes a first surface and several die areas are formed above the substrate. At operation 202, the first surface is cut to form a first recess in the substrate. The first recess includes a first depth and is located between at least two of several die areas. At operation 203, the several dies are singulated from the wafer by further cutting the substrate from a bottom surface of the first recess with a cut width smaller than a width of the bottom surface of the first recess, thereby forming a second recess with a second depth. The second depth is substantially greater than or equal to the first depth.

FIGS. 13 to 19 have been simplified for a better understanding of the concepts of the present disclosure. In FIGS. 13 to 19, elements with the same labeling numbers as those in FIGS. 1 to 11 are previously discussed with reference thereto and are not repeated here for simplicity.

Figure 13:
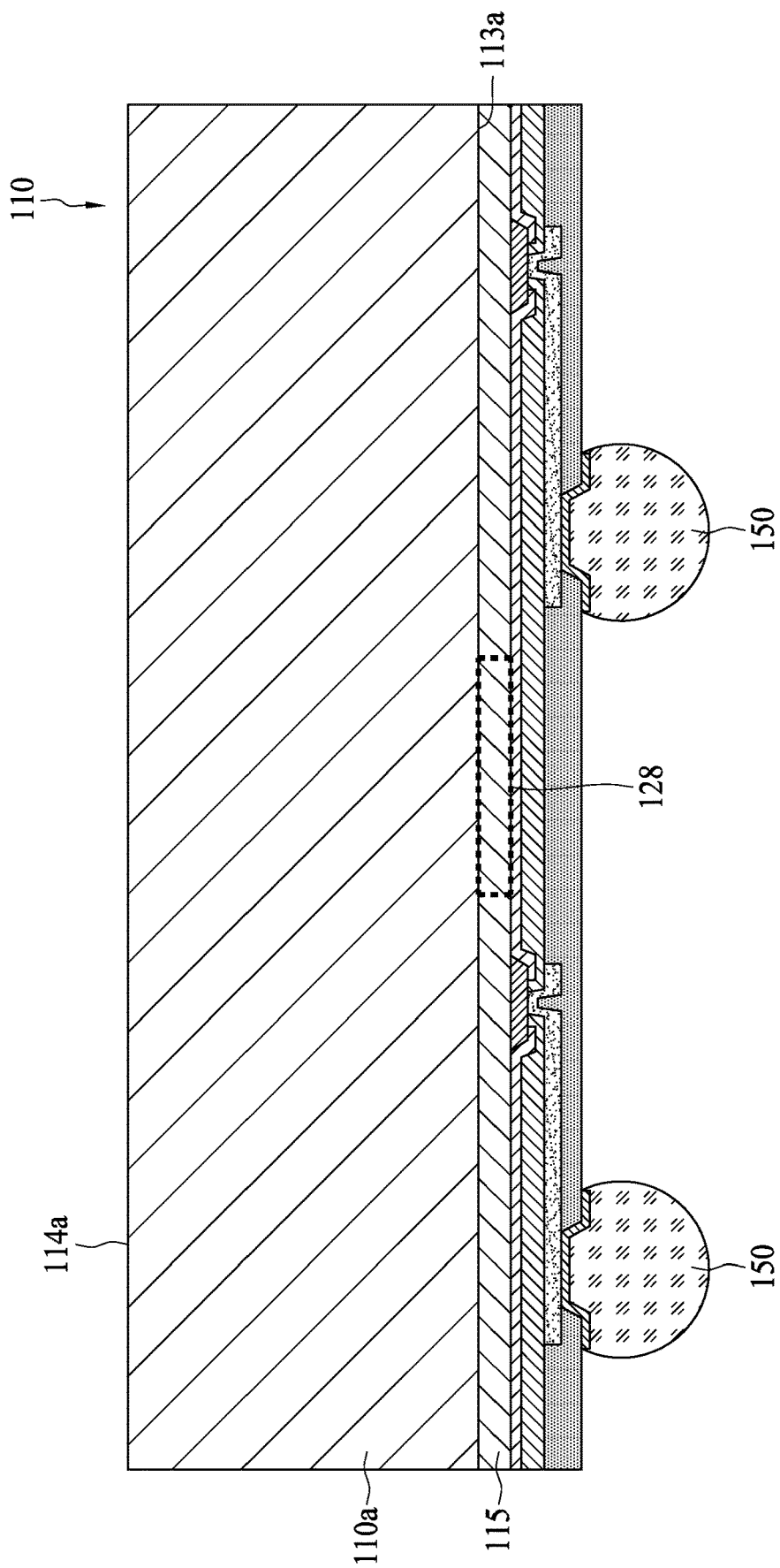
FIGS. 13 to 19 are cross-sectional views corresponding to various operations in FIG. 12.

Referring to FIG. 13, the wafer 110 is received into an operation chamber. The wafer 110 also includes the substrate 110a, and the interconnect structure 115. The substrate 110a includes a surface 113a and a surface 114a. In some embodiments, the method 200 further includes flipping over the wafer 110 prior to the cutting the surface 114a. At least one seal ring (not shown) is located adjacent to the scribe line 128 of the substrate 110a.

Figure 14:
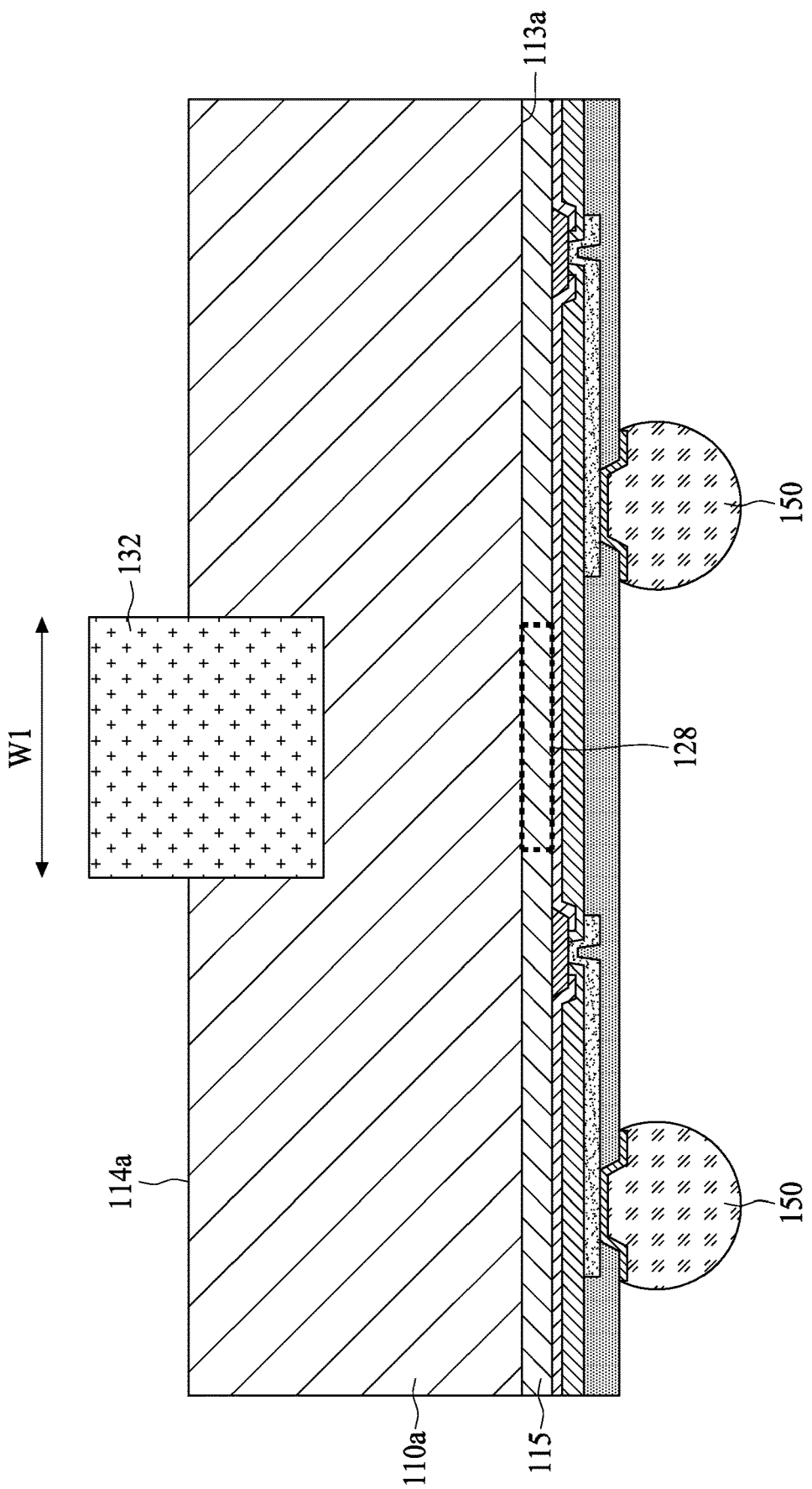

In some embodiments, as in FIG. 14, the substrate 110a is sawed by a first blade 132 through the surface 114a when several bumps 150 are disposed above the substrate 110a. In alternative embodiments, the bumps 150 are not disposed above the first surface 113a until the first blade 132 cuts through the second surface 114a.

In some embodiments, the substrate 110a is cut inside and above a position where the scribe line 128 is located. The position is between at least two of the bumps 150. The first blade 132 is moved downward inside the substrate 110a and above the scribe line 128, so as to remove some of the substrate 110a. In some embodiments, the first blade 132 is a mechanical saw. In certain embodiments, the first blade 132 includes a width W1.

Figure 15:
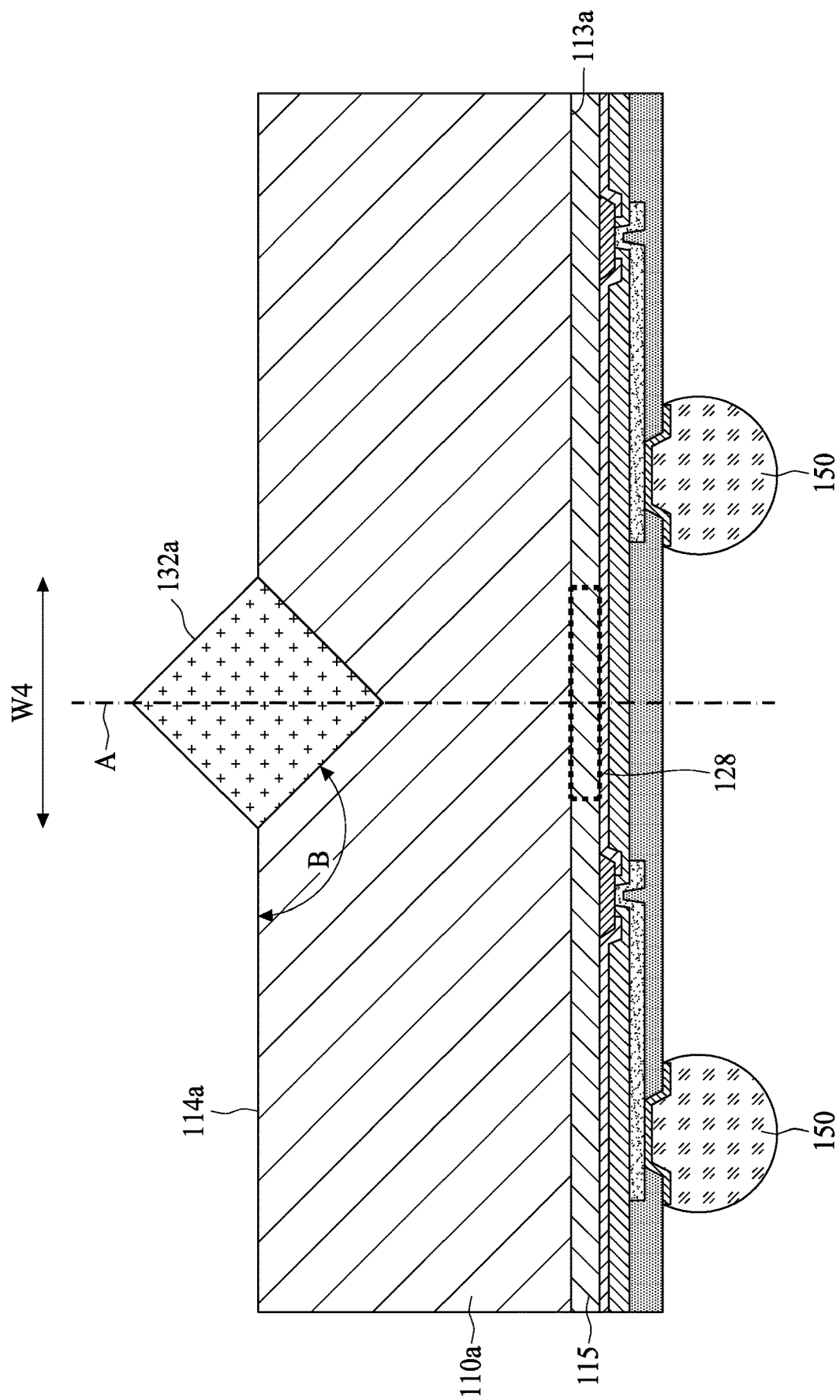

In some embodiments, as in FIG. 15, the first blade 132a is a rhombus saw and has a diagonal W4 of the first blade 132a. As such, the substrate 110a is fabricated to form a notch shown as the notch 134c of the substrate 111c shown in FIG. 7. After the first blade 132a is removed, a first recess is formed and includes an inclined sidewall as well as the side wall 133 shown in FIG. 7. As shown in FIG. 15, the inclined sidewall is slanting toward a central axis A of the first recess. In this case, the second surface 114a forms an obtuse angle B with respect to the inclined sidewall as well as the obtuse angle α shown in FIG. 7.

Figure 16:
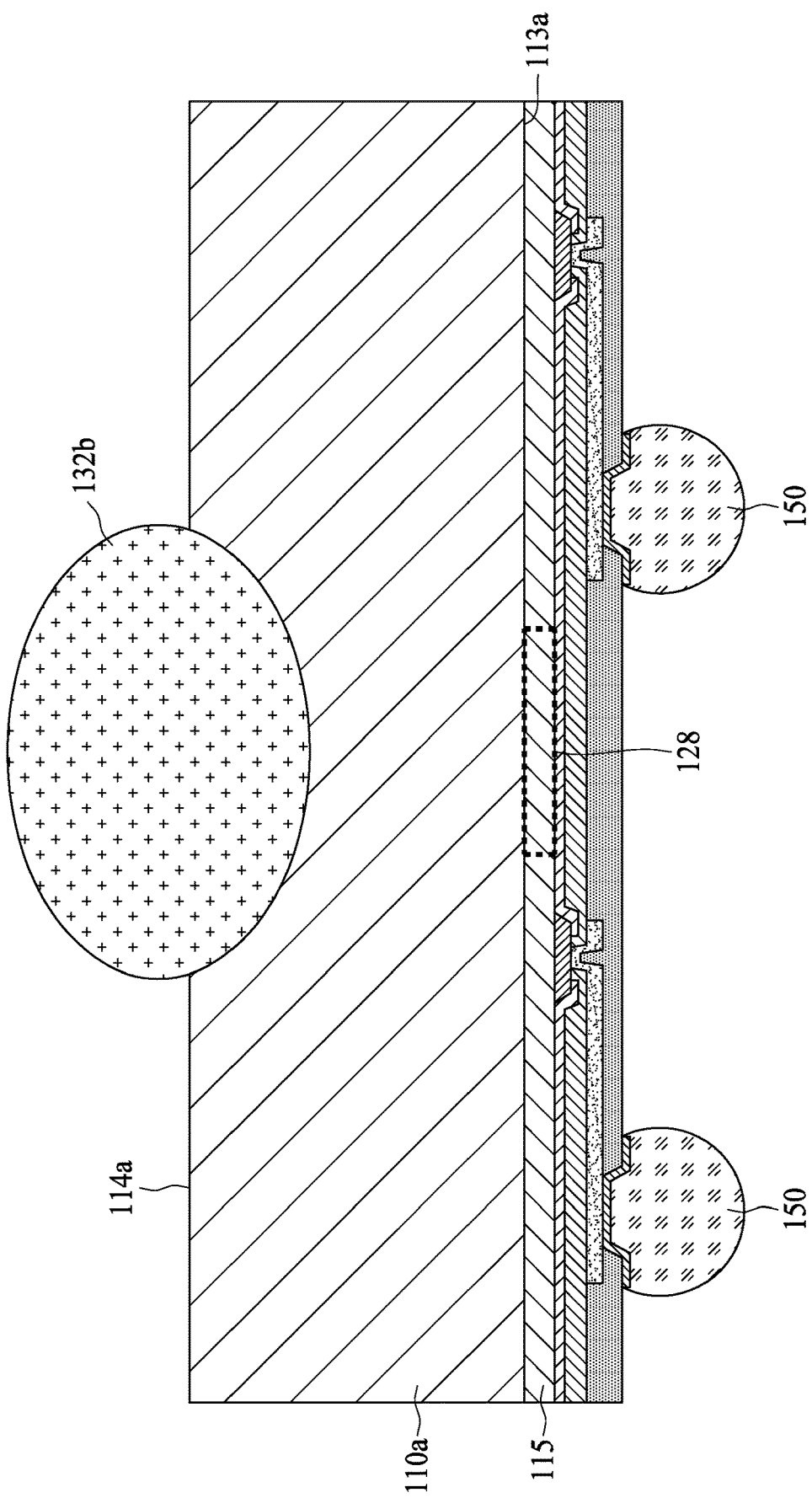

In some embodiments, as in FIG. 16, the first blade 132b is a circular-like saw so that the substrate 110a is fabricated to form a notch shown as the notch 134d of the substrate 110d shown in FIG. 8.

Figure 17:
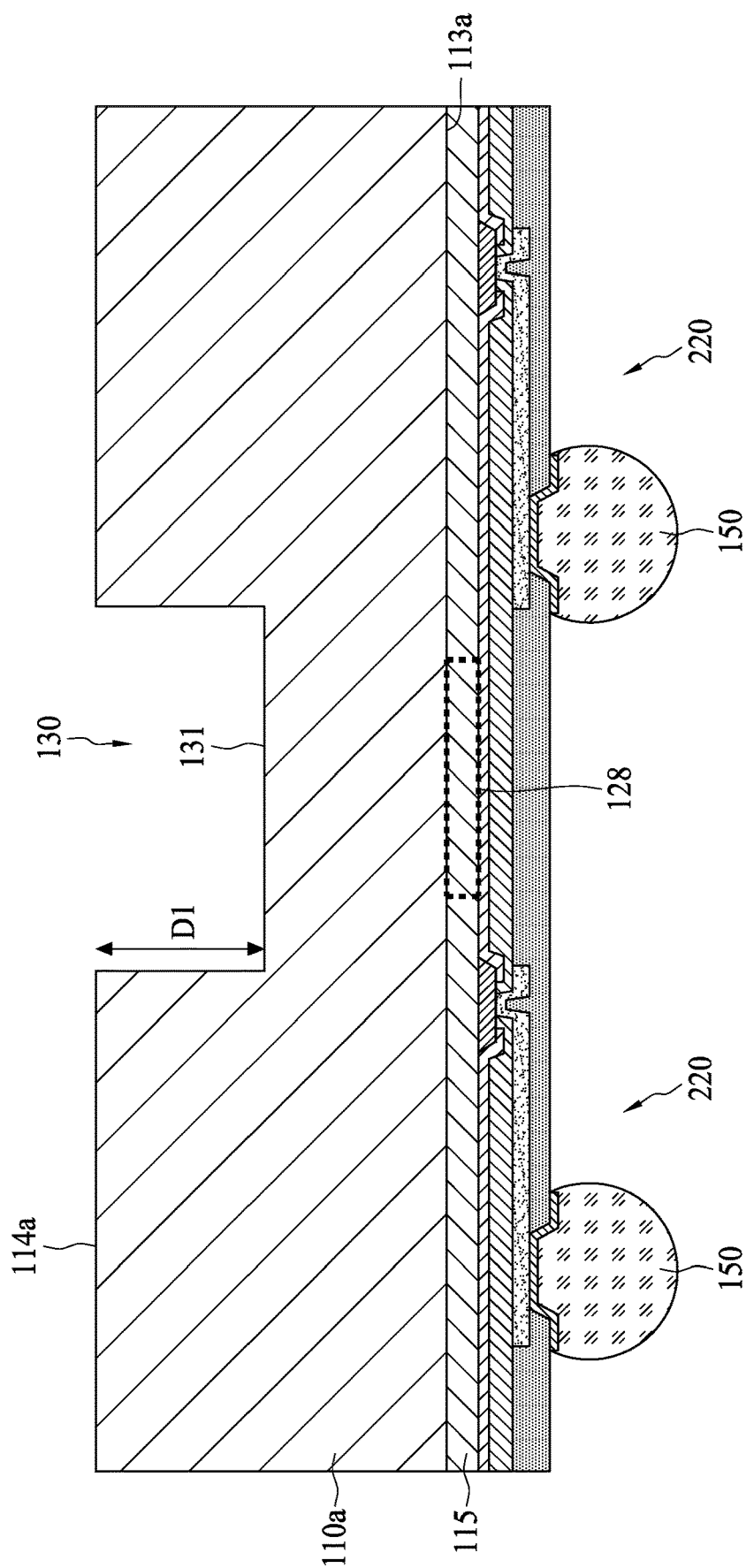

In operation 202, as in FIG. 17, a first recess 130 is formed in the substrate 110a. More particular for some embodiments, the first recess 130 is formed in the substrate 110a without extending through the interconnect structure 115. In other words, forming the first recess 130 performed by the first blade 132 does not penetrate through the interconnect structure 115. The first recess 130 includes a first depth D1 and the first recess 130 is located between at least two adjacent die areas 220.

Figure 18:
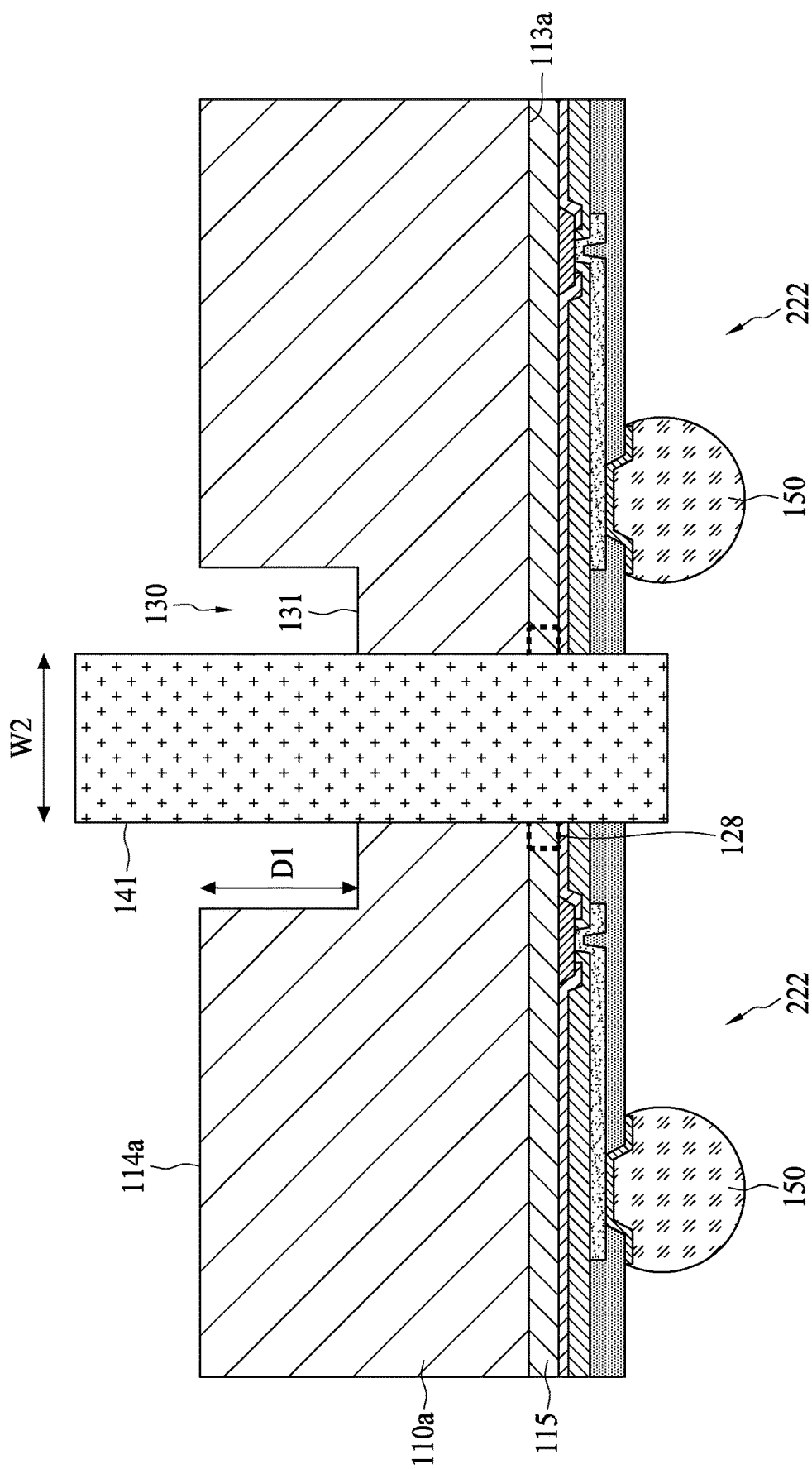

In some embodiments, the method 200 further includes changing a first blade 132 into a second blade 141 as shown in FIG. 18 prior to performing singulation between dies 222.

In some embodiments, as in FIG. 18, several dies 222 are singulated by the second blade 141 through further cutting of the substrate 110a from a bottom surface 131 of the first recess 130. The second blade 141 includes a width W2, which is smaller than the width W1 of the bottom surface 131 of the first recess 130. In other words, a width W2 of the second blade 141 is smaller than the width W1 of the first blade 132.

In some embodiments, the method 200 further includes a molding as that shown in FIG. 9 disposed above the first surface 113a. In this case, the second blade 141 shown in FIG. 18 not only cuts through the scribe line 128 but also cuts through the molding 160 so as to singulate dies 222 in order to form a singulated die 222 as well as the semiconductor device 10e shown in FIG. 9.

Figure 19:
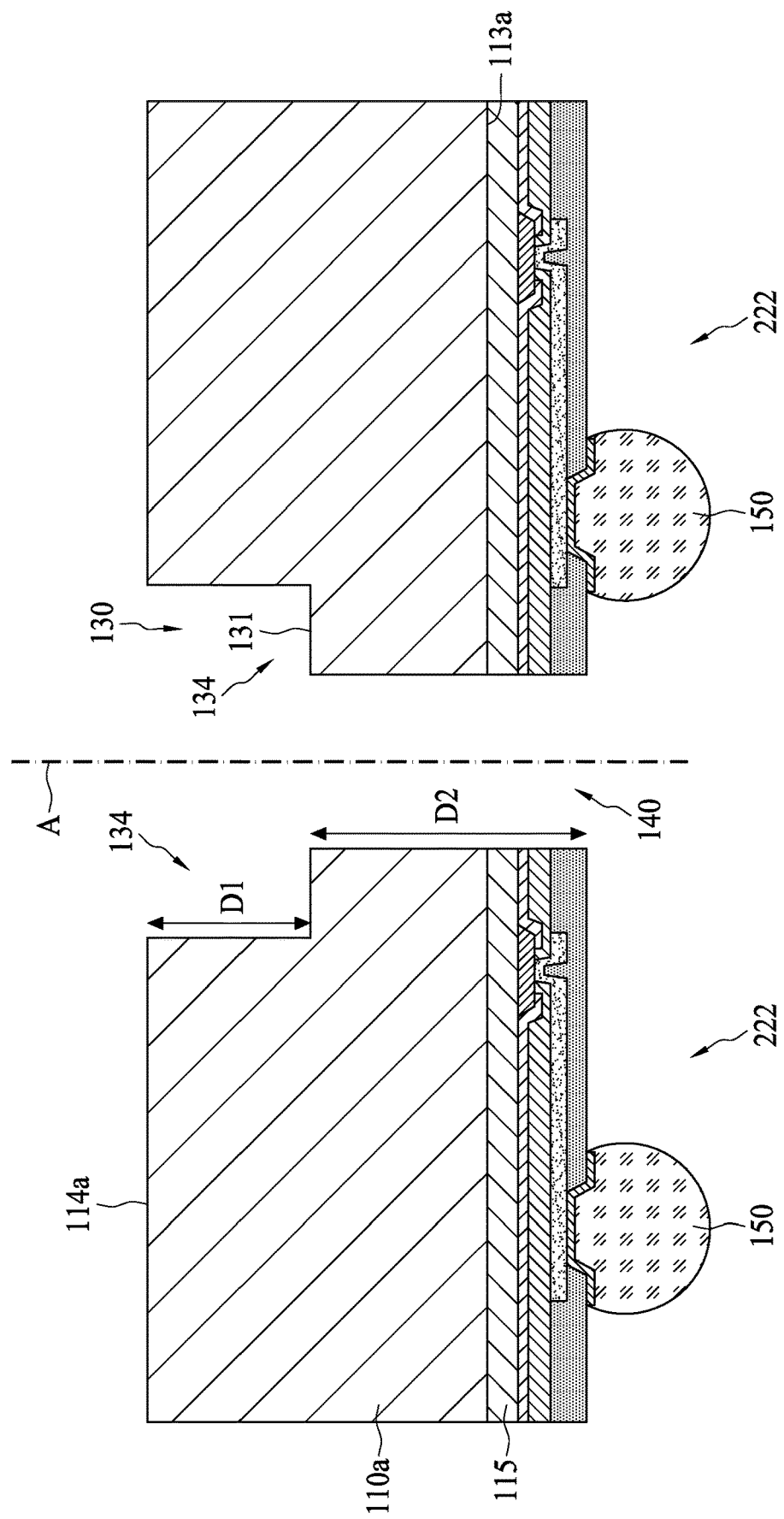

In some embodiments, after the second blade 141 is removed, as shown in FIG. 19, a second recess 140 is formed. The second recess 140 includes a second depth D2, which is substantially greater than or equal to the first depth D1 of the first recess 130.

In some embodiments, as in FIG. 19, the first recess 130 and the second recess 140 share the same central axis A. Since the width W1 of the first blade and the width W2 of the second blade are difference, the width difference between the first recess 130 and the second recess 140 is predetermined and forms two notches 134 facing each other. Because the width difference is predetermined, the width of the notch 134 is also predetermined accordingly so as to avoid corner hitting between the detached die and adjacent dies.

In some embodiments, the method 200 further includes a grinding operation. The grinding operation includes performing a chemical-mechanical-polishing on the second surface 114a. Since the grinding operation reduces the thickness of the substrate 110a, the first depth D1 of the first recess 130 is reduced accordingly. In certain embodiments, the grinding operation is performed prior to either forming the first recess 130 or forming the second recess 140. The grinding operation causes the thickness (e.g., about 4 mil) of the substrate 110a to be thinner than its original thickness (e.g., about 31 mil) of the substrate 110a.

Figure 20:
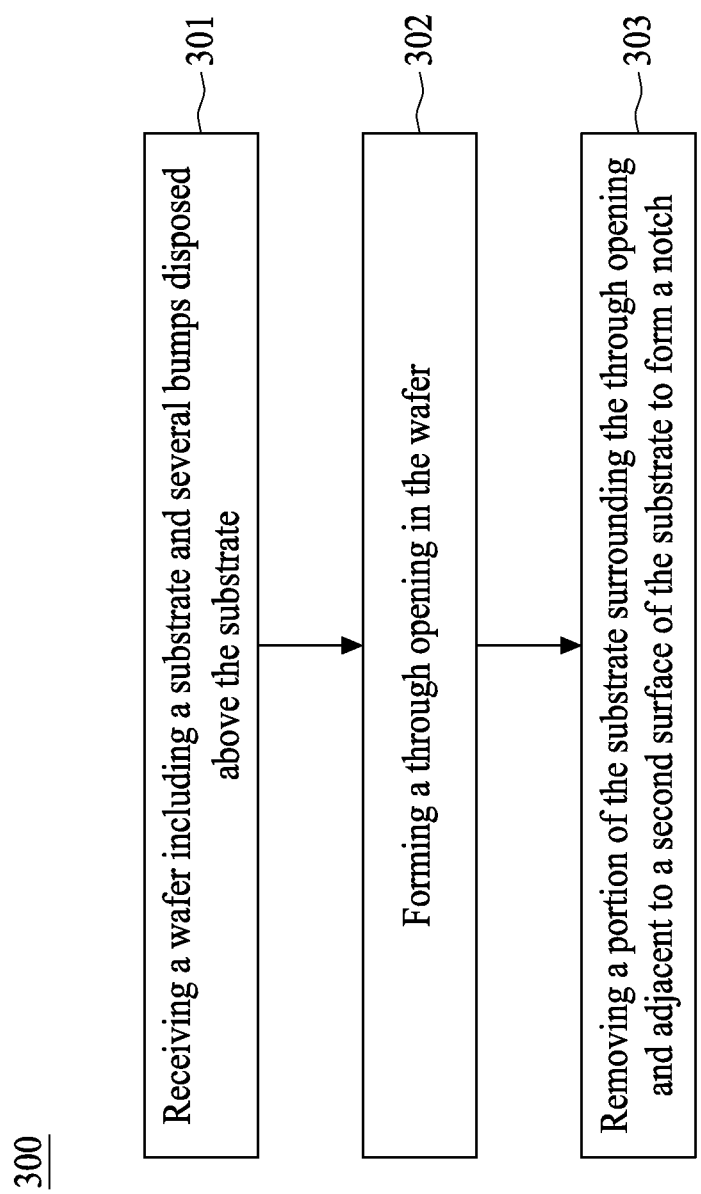
FIG. 20 is a flowchart of a method for manufacturing a semiconductor device in accordance with certain embodiments of the present disclosure.

FIG. 20 is a diagram of a method 300 for manufacturing a semiconductor device in accordance with some embodiments of the present disclosure. The method 300 includes several operations which are discussed in detail with reference to FIGS. 21 to 25. At operation 301, a wafer is received. The wafer includes a substrate and several bumps, which are disposed above a first surface of the substrate. At operation 302, a through opening is formed in the wafer, thereby performing a singulation operation. At operation 303, a portion of the substrate surrounding the through opening is removed. The portion of the substrate is adjacent to a second surface of the substrate so as to form a notch at a sidewall of the through opening. The second surface of the substrate is opposite to the first surface of the substrate.

FIGS. 21 to 25 have been simplified for a better understanding of the concepts of the present disclosure. In FIGS. 21 to 25, elements with the same labeling numbers as those in FIGS. 1 to 11 are previously discussed with reference thereto and are not repeated here for simplicity.

Figure 21:
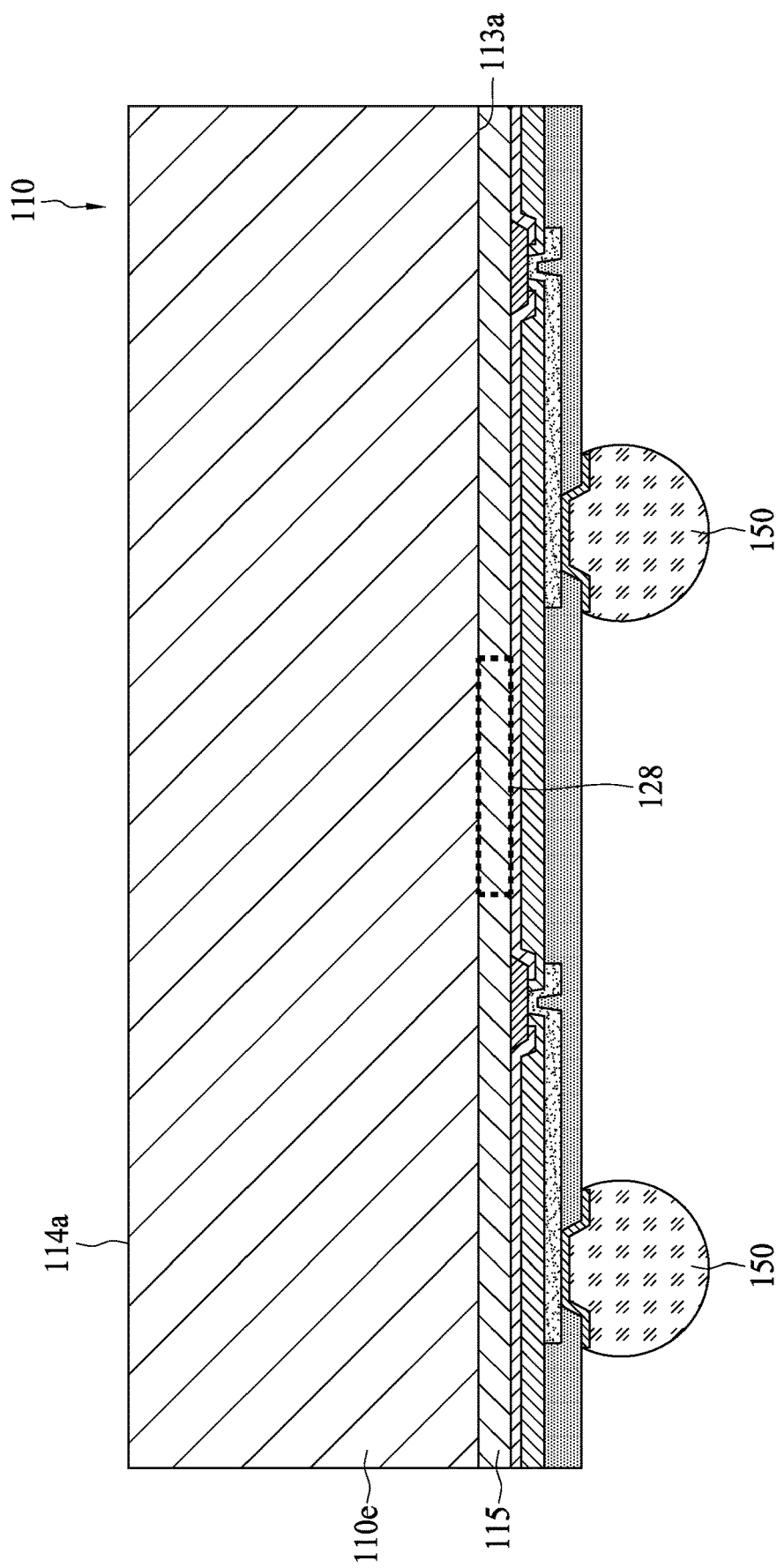
FIGS. 21 to 25 are cross-sectional views corresponding to various operations in FIG. 20.

Referring to FIG. 21, a wafer 110 is received. The wafer 110 includes a substrate 110e, the interconnect structure 115 and several bumps 150, which are disposed above a first surface 113a of the substrate 110e.

Figure 22:
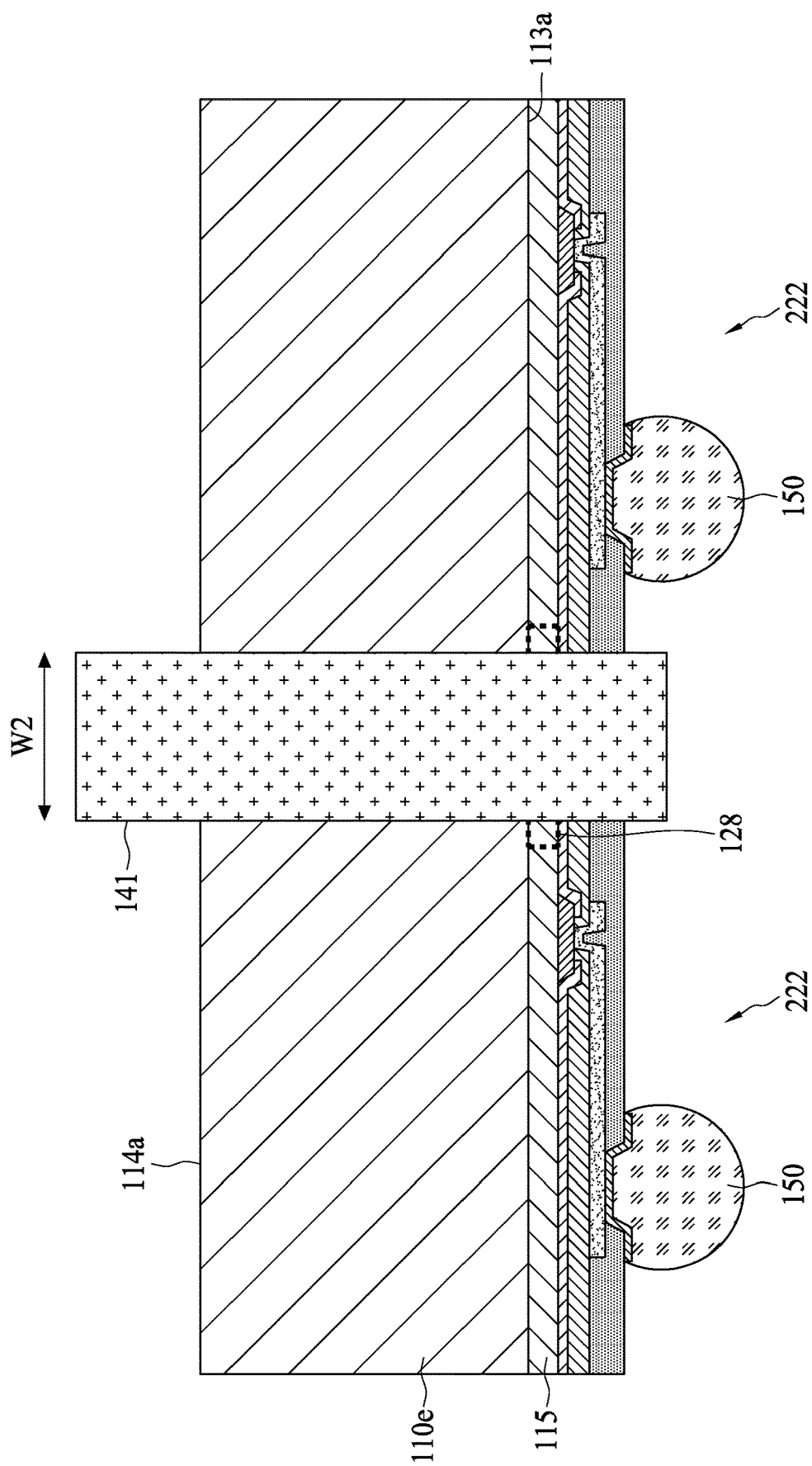

In the operation 302, as shown in FIG. 22, the second blade 141 cuts through the substrate 110e and the interconnect structure 115. In some embodiments, if a molding is disposed above the first surface 113a of the substrate 110e, the second blade 141 also cuts through the molding so as to separate two adjacent dies 222.

Figure 23:
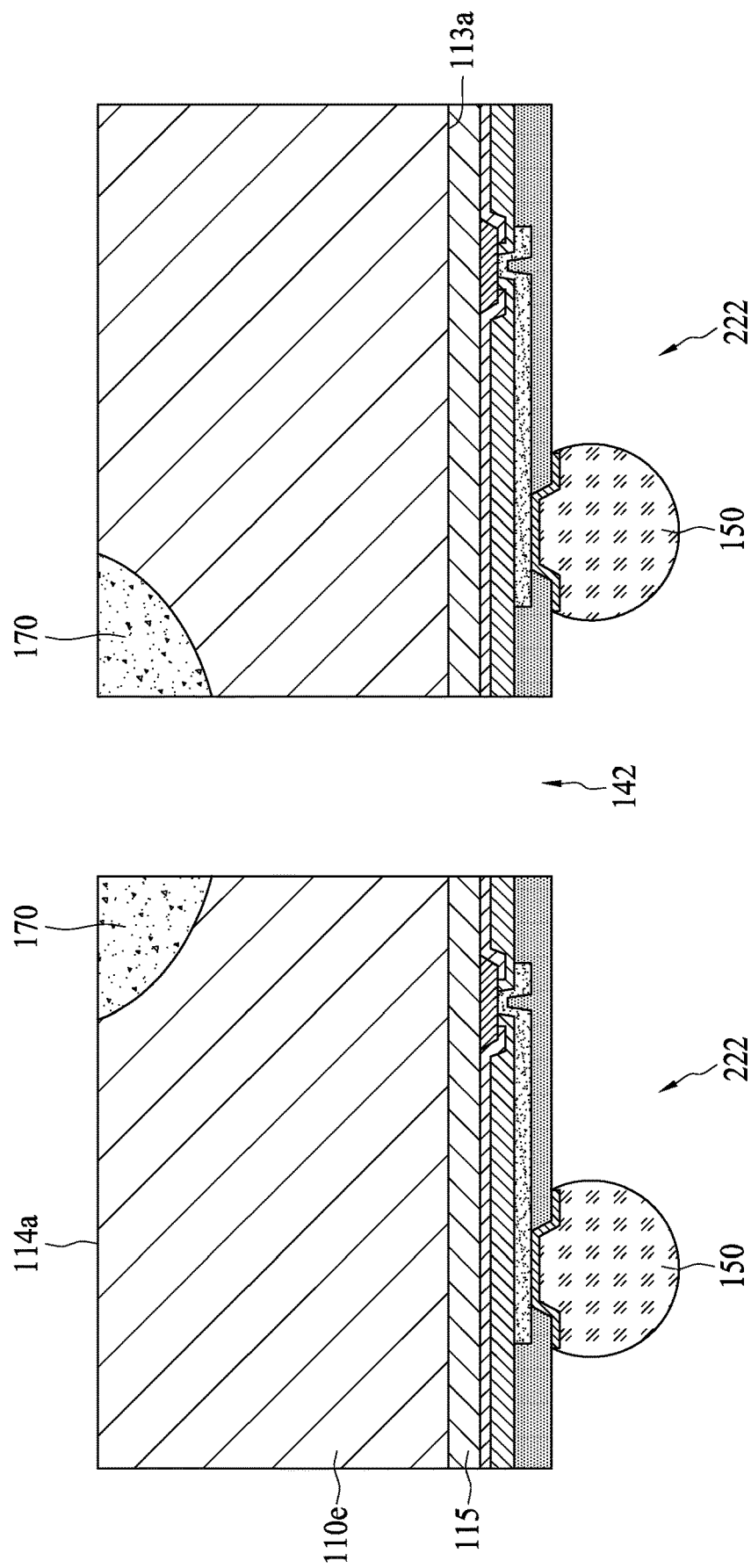

In some embodiments, as in FIG. 23, after the second blade 141 is removed, a through opening 142 is formed, thereby performing a singulation operation for separating dies 222. In some embodiments, prior to the forming of the through opening 142, an alignment with reference to the first surface 113a is performed on the substrate 110e to determine a position where the second blade 141 cuts through to avoid damaging functionality of the dies 222. The aligning of the substrate 110e is performed by an infrared (IP) inspection. After the through opening 142 is formed in the substrate 110e, a portion 170 of the substrate 110e surrounding the through opening 142 and adjacent to a second surface 114a is exposed. The second surface 114a of the substrate 110e is opposite to the first surface 113a of the substrate 110e.

Figure 24:
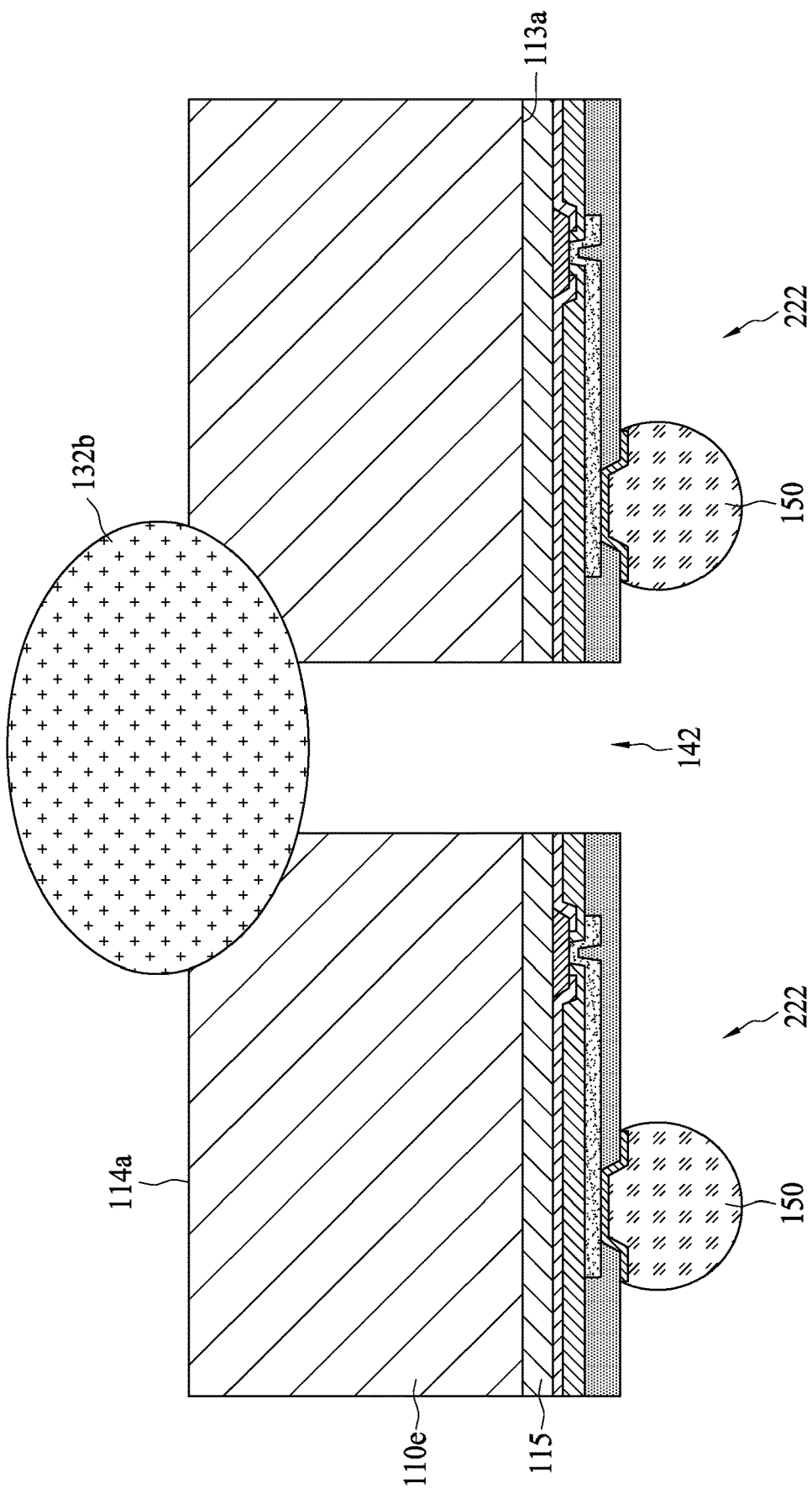
Figure 25:
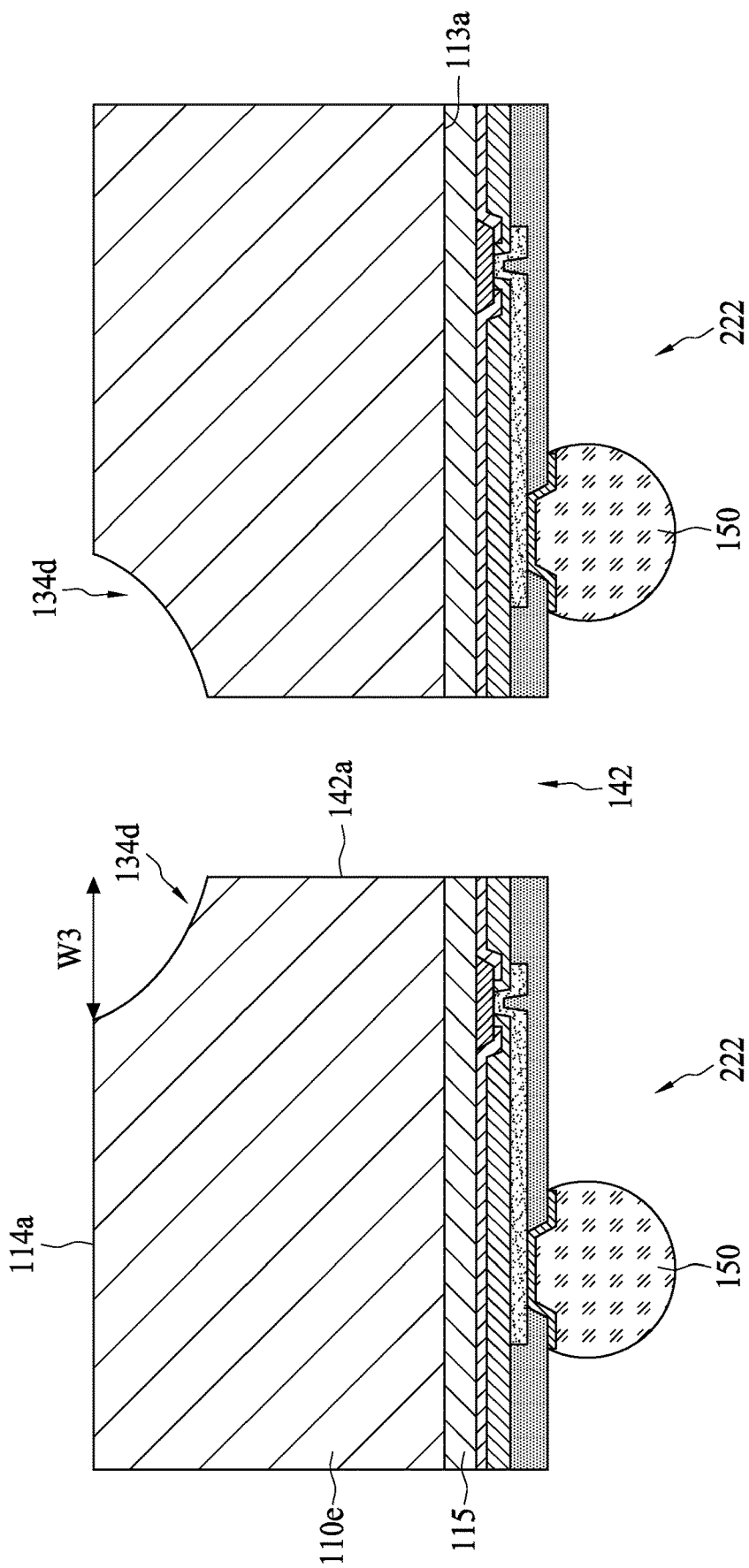

In some embodiments, as in FIG. 24, the first blade 132b removes the portion 170 of the substrate 110e so as to form two notches 134d shown in FIG. 25. The notch 134d is at a sidewall 142a of the through opening 142 and includes a width W3 greater than about 10 μM. After the singulation and removal operation is performed by the above-mentioned operations, the semiconductor device is fabricated as well as the semiconductor device 10d shown in FIG. 8 so that the notch 134d of the semiconductor device 10d avoids damages due to the corners being hit.

In some embodiments, a method of manufacturing a semiconductor device includes receiving a wafer including a substrate, wherein the substrate includes a first surface and several die areas are formed above the substrate. The method also includes cutting the first surface to form a first recess in the substrate. The first recess includes a first depth and the first recess is located between at least two of the plurality of die areas. The method also includes singulating several dies by further cutting the substrate from a bottom surface of the first recess with a cut width smaller than a width of the bottom surface of the first recess, thereby forming a second recess with a second depth, which is substantially greater than or equal to the first depth.

In some embodiments, a method of manufacturing a semiconductor device includes receiving a wafer including a substrate and several bumps, which are disposed above a first surface of the substrate. The method also includes forming a through opening in the wafer, thereby performing a singulation operation. The method also includes removing a portion of the substrate surrounding the through opening and adjacent to a second surface of the substrate so as to form a notch at a sidewall of the through opening. The second surface of the substrate is opposite to the first surface of the substrate.

In some embodiments, a semiconductor device includes a substrate, a bump and a seal ring. The substrate includes a first surface and a second surface. A notch is at the second surface and at a sidewall of the substrate. A depth of the notch is smaller than about half the thickness of the substrate. A bump is disposed above the first surface of the substrate.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

As used in this application, "or" is intended to mean an inclusive "or" rather than an exclusive "or." In addition, "a" and "an" as used in this application are generally to be construed to mean "one or more" unless specified otherwise or clear from context to be directed to a singular form. Furthermore, to the extent that "includes", "having", "has", "with", or variants thereof are used in either the detailed description or the claims, such terms are intended to be inclusive in a manner similar to "comprising."

The invention claimed is:

1. A method of manufacturing a semiconductor device, comprising:

receiving a wafer including a substrate, wherein the substrate includes a first surface, and a first and a second die areas are formed above the substrate, and the first surface is an exposed surface of the substrate, an interconnect structure is disposed between the substrate and the first and the second die areas, and the interconnect structure is configured to be an integrated circuit, the first die area comprises a first metal pad disposed on the interconnect structure, a first post-passivation interconnect (PPI) having a first end disposed on the first metal pad, and a first bump disposed on a second end of the first PPI, the second die area comprises a second metal pad disposed on the interconnect structure, a second PPI having a first end disposed on the second metal pad, and a second bump disposed on a second end of the second PPI, a passivation layer is disposed over the first metal pad and the second metal pad, a polymer layer is disposed over the passivation layer, and the polymer layer is in direct contact with the first metal pad, the second metal pad, the first PPI, the second PPI and the passivation layer;

cutting the exposed surface to form a first recess in the substrate, wherein the first recess comprises a first depth and the first recess is located between the first and the second die areas and on the opposite side to the first and the second bumps, the first recess has an arc surface entirely formed by the substrate, the first recess partially overlaps the first metal pad, the first PPI, the passivation layer, the polymer layer and the second bump, and the first recess is entirely offset from the second metal pad and the first bump;

after the first recess is formed, grinding the exposed surface to reduce the first depth of the first recess;

after the exposed surface is grinded, singulating the wafer to form a plurality of dies by further cutting the substrate from the bottom surface of the first recess with a cut width smaller than a width of the bottom surface of the first recess, thereby forming a second recess with a second depth, wherein a plurality of bottoms of the plurality of dies are attached on a dicing tape respectively, and the second recess penetrates the substrate, the interconnect structure, the passivation layer and the polymer layer; and detaching a first die in the plurality of dies from the dicing tape by using an eject pin to push a bottom of the first die to make a bottom corner of the first die to pass through the first recess of a second die in the plurality of die such that the bottom corner does not hit the second die.

2. The method of claim 1, further comprising disposing the first and the second bumps above a second surface of the substrate, wherein the first and the second bumps are electrically connected to the first and the second PPIs of the plurality of dies respectively.

3. The method of claim 2, further comprising disposing a molding on the second surface of the substrate and between the first and the second bumps.

4. The method of claim 1, further comprising flipping over the wafer prior to the cutting of the first surface.

5. The method of claim 1, further comprising changing a first blade into a second blade prior to performing singulation of the plurality of dies.

6. The method of claim 5, wherein the cutting of the first recess is performed by the first blade, and the cutting of the second recess is performed by the second blade.

7. The method of claim 5, wherein a width of the second blade is smaller than a width of the first blade.

8. The method of claim 1, wherein the first recess and the second recess share a same central axis.

9. A method of manufacturing a semiconductor device, comprising:

receiving a wafer including a substrate, wherein the substrate includes a first surface and a second surface opposite to the first surface, a first die area and a second die area formed above the substrate, an interconnect structure configured to be an integrated circuit and disposed over the first surface between the substrate and the first die area and the second die area, a first metal pad disposed on the interconnect structure in the first die area, a first post-passivation interconnect (PPI) disposed in the first die area and having a first end disposed on the first metal pad, and a first bump disposed on a second end of the first PPI in the first die area, a second metal pad disposed on the interconnect structure in the second die area, a second PPI disposed in the second die area and having a first end disposed on the second metal pad, a second bump disposed on a second end of the second PPI in the second die area, a passivation layer disposed over the first metal pad and the second metal pad, a first polymer layer disposed over the passivation layer, and a second polymer layer disposed over the first PPI and the second PPI;

cutting the second surface to form a first recess in the substrate, wherein the first recess comprises a first depth and the first recess is located between the first die area and the second die area, the first recess has an arc surface entirely formed by the substrate, the first recess overlaps a portion of the first metal pad, a portion of the first PPI, a portion of the second PPI, a portion of the passivation layer, a portion of the first polymer layer, a portion of the second polymer layer and a portion of the second bump, and the first recess is entirely offset from the second metal pad and the first bump;

grinding the second surface of the substrate to reduce the first depth of the first recess after the forming of the first recess;

cutting the substrate from the second surface to singulate the wafer to form a plurality of dies after the grinding of the second surface and to form a second recess with a second depth, wherein a cut width is smaller than a width of the bottom surface of the first recess, a plurality of bottoms of the plurality of dies are attached on a dicing tape respectively, and the second recess penetrates the substrate, the interconnect structure, the passivation layer, the first polymer layer and the second polymer layer; and detaching a first die in the plurality of dies from the dicing tape by using an eject pin to push a bottom of the first die to make a bottom corner of the first die to pass through the first recess of a second die in the plurality of die such that the bottom corner does not hit the second die.

10. The method of claim 9, wherein the first PPI and the second PPI are disposed between the first polymer layer and the second polymer layer.

11. The method of claim 9, wherein the first bump is electrically connected to the first metal pad by the first PPI, and the second bump is electrically connected to the second metal pad by the second PPI.

12. The method of claim 9, wherein the first recess has a first width, the second recess has a second width, and the first width of the first recess is greater than the second width of the second recess.

13. The method of claim 12, wherein the substrate further comprises a scribe line, and the first width of the first recess and the second width of the second recess are greater than a width of the scribe line.

14. The method of claim 9, wherein the second depth of the second recess is greater than the first depth of the first recess after the grinding of the second surface of the substrate.

15. The method of claim 9, wherein the substrate recess and the second recess share a same central axis.

16. A method of manufacturing a semiconductor device, comprising:

receiving a wafer including a substrate, wherein the substrate includes a first surface, a second surface opposite to the first surface, a first die area and a second die area are formed above the substrate, an interconnect structure disposed between the substrate and the first die area and the second die area, a first metal pad disposed on the interconnect structure in the first die area, a first PPI having a first end disposed on the first metal pad in the first die area, a first bump disposed on a second end of the first PPI in the first die area, a second metal pad disposed on the interconnect structure in the second die area, a second PPI having a first end disposed on the second metal pad in the second die area, a second bump disposed on a second end of the second PPI in the second die area, a passivation layer disposed over the first metal pad and the second metal pad, a polymer layer disposed over the passivation layer, and a molding disposed over the first PPI and the second PPI and between the first bump and the second bump;

cutting the second surface to form a first recess in the substrate between the first and the second die areas, wherein the first recess is entirely formed by the substrate, the first recess overlaps a portion of the first metal pad, a portion of the passivation layer, a portion of the polymer layer, a portion the second bump and a portion of the molding, and the first recess is entirely offset from the second metal pad and the first bump;

grinding the second surface to reduce the first depth of the first recess after the forming of the first recess;

cutting the substrate from the second surface to form a second recess penetrating the substrate, the interconnect structure, the passivation layer, the polymer layer and the molding to singulate the wafer to form a plurality of dies, wherein a cut width is smaller than a width of a bottom surface of the first recess, and bottoms of the plurality of dies are attached on a dicing tape respectively; and detaching a first die in the plurality of dies from the dicing tape by using an eject pin to push a bottom of the first die to make a bottom corner of the first die to pass through the first recess of a second die in the plurality of die such that the bottom corner does not hit the second die.

17. The method of claim 16, wherein the first PPI and the second PPI are disposed between the polymer layer and the molding.

18. The method of claim 16, wherein the first bump is electrically connected to the first metal pad by the first PPI, and the second bump is electrically connected to the second metal pad by the second PPI.

19. The method of claim 16, wherein the first recess has a first width, the second recess has a second width, the first width of the first recess is greater than the second width of the second recess, and the second recess of the second recess is greater than the first depth of the first recess after the grinding of the second surface of the substrate.

20. The method of claim 16, wherein the substrate recess and the second recess share a same central axis.

* * * * *